(12) United States Patent
Okajima

(10) Patent No.: US 11,387,227 B2
(45) Date of Patent: Jul. 12, 2022

(54) MEMORY DEVICE HAVING MULTIPLE CHIPS AND METHOD FOR MANUFACTURING THE SAME

(71) Applicant: KIOXIA CORPORATION, Tokyo (JP)

(72) Inventor: Mutsumi Okajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/017,101

(22) Filed: Sep. 10, 2020

(65) Prior Publication Data
US 2021/0305230 A1 Sep. 30, 2021

(30) Foreign Application Priority Data
Mar. 24, 2020 (JP) .............. JP2020-052006

(51) Int. Cl.
*H01L 25/00* (2006.01)
*H01L 25/18* (2006.01)
*H01L 27/22* (2006.01)
*H01L 27/108* (2006.01)
*H01L 23/00* (2006.01)
*H01L 21/02* (2006.01)
(Continued)

(52) U.S. Cl.
CPC .............. *H01L 25/50* (2013.01); *H01L 24/08* (2013.01); *H01L 24/80* (2013.01); *H01L 25/18* (2013.01); *G11C 11/161* (2013.01); *G11C 11/407* (2013.01); *H01L 21/02244* (2013.01); *H01L 21/02258* (2013.01); *H01L 27/10852* (2013.01); *H01L 27/224* (2013.01); *H01L 2224/08145* (2013.01); *H01L 2224/8013* (2013.01); *H01L 2924/1436* (2013.01)

(58) Field of Classification Search
CPC ......... H01L 25/50; H01L 24/08; H01L 24/80; H01L 25/18; H01L 21/02244; H01L 21/02258; H01L 27/10852; H01L 27/224; H01L 2224/08145; H01L 2224/8013; H01L 2924/1436; H01L 43/08; H01L 43/12; G11C 11/161; G11C 11/407
USPC ......................................... 257/421
See application file for complete search history.

(56) References Cited

U.S. PATENT DOCUMENTS

| 8,456,883 B1 * | 6/2013 | Liu ................ H01L 27/0688 365/66 |
| 9,293,696 B2 | 3/2016 | Ootera et al. |
| 9,396,811 B2 | 7/2016 | Ootera et al. |

(Continued)

FOREIGN PATENT DOCUMENTS

| JP | 6220292 B2 | 10/2017 |
| JP | 6271350 B2 | 1/2018 |
| JP | 6271370 B2 | 1/2018 |

*Primary Examiner* — Duy T Nguyen
(74) *Attorney, Agent, or Firm* — Finnegan, Henderson, Farabow, Garrett & Dunner L.L.P.

(57) ABSTRACT

According to one embodiment, a memory device includes: a first chip including a first insulating layer and a first pad; a plurality of memory units provided in a first area of the first insulating layer and arranged at first intervals in a first direction parallel to a surface of the first chip; a plurality of mark portions provided in a second area of the first insulating layer and arranged at second intervals in the first direction; a second chip including a second pad connected to the first pad and overlapping the first chip in a second direction perpendicular to the surface of the first chip; and a circuit provided in the second chip.

15 Claims, 28 Drawing Sheets

(51) Int. Cl.
*G11C 11/407* (2006.01)
*G11C 11/16* (2006.01)

(56) References Cited

U.S. PATENT DOCUMENTS

| | | |
|---|---|---|
| 9,515,124 B2 | 12/2016 | Nakamura et al. |
| 10,629,616 B1* | 4/2020 | Kai .......................... H01L 24/92 |
| 2002/0074668 A1* | 6/2002 | Hofstee ............... H01L 25/0657 |
| | | 257/737 |
| 2008/0080113 A1* | 4/2008 | Lin ....................... H01L 23/552 |
| | | 361/56 |
| 2010/0044664 A1* | 2/2010 | Liu ....................... H01L 45/144 |
| | | 257/2 |
| 2010/0246152 A1* | 9/2010 | Lin ....................... H01L 23/481 |
| | | 361/783 |
| 2016/0260774 A1* | 9/2016 | Umebayashi ........... G11C 11/16 |

* cited by examiner

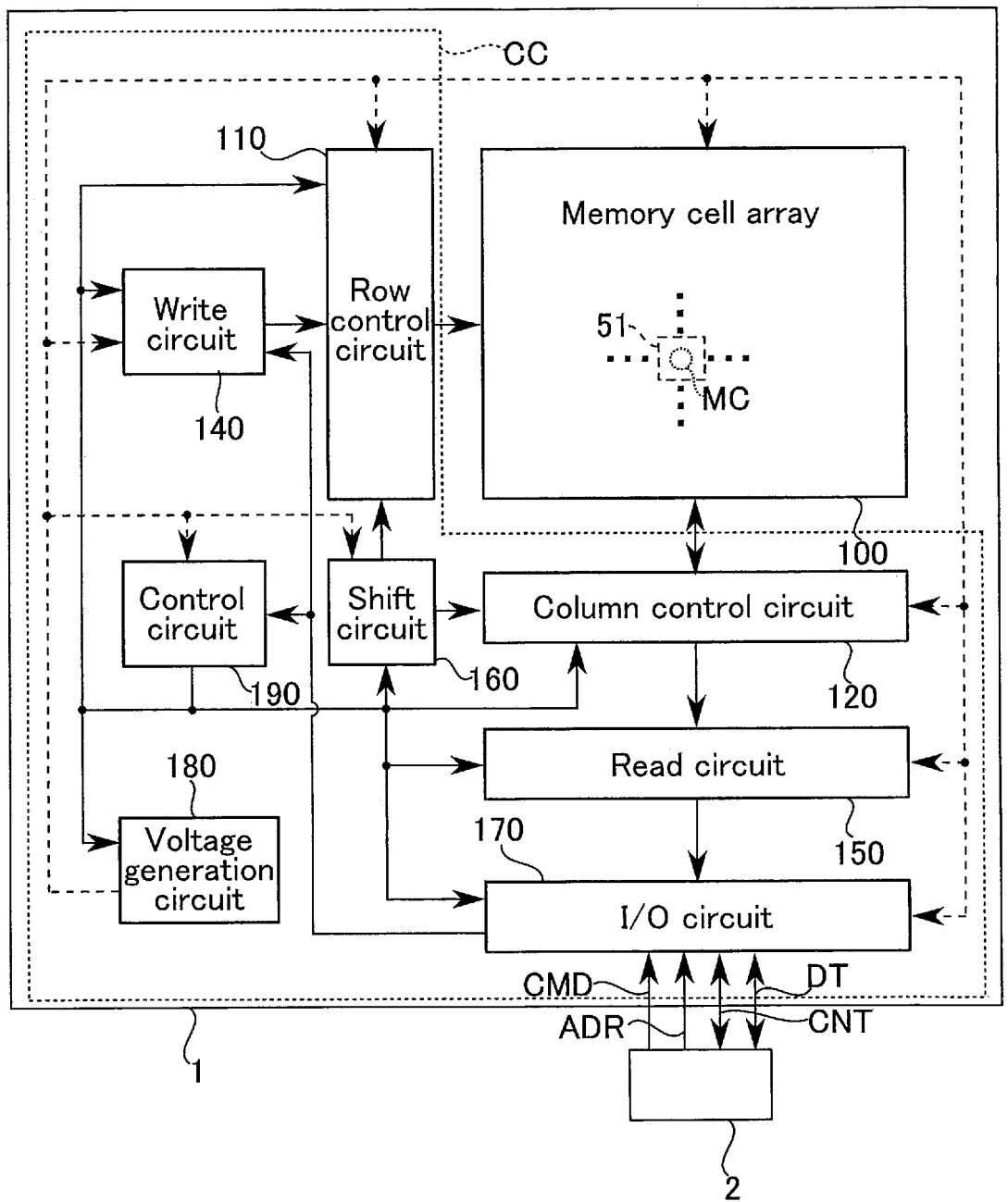
F I G. 1

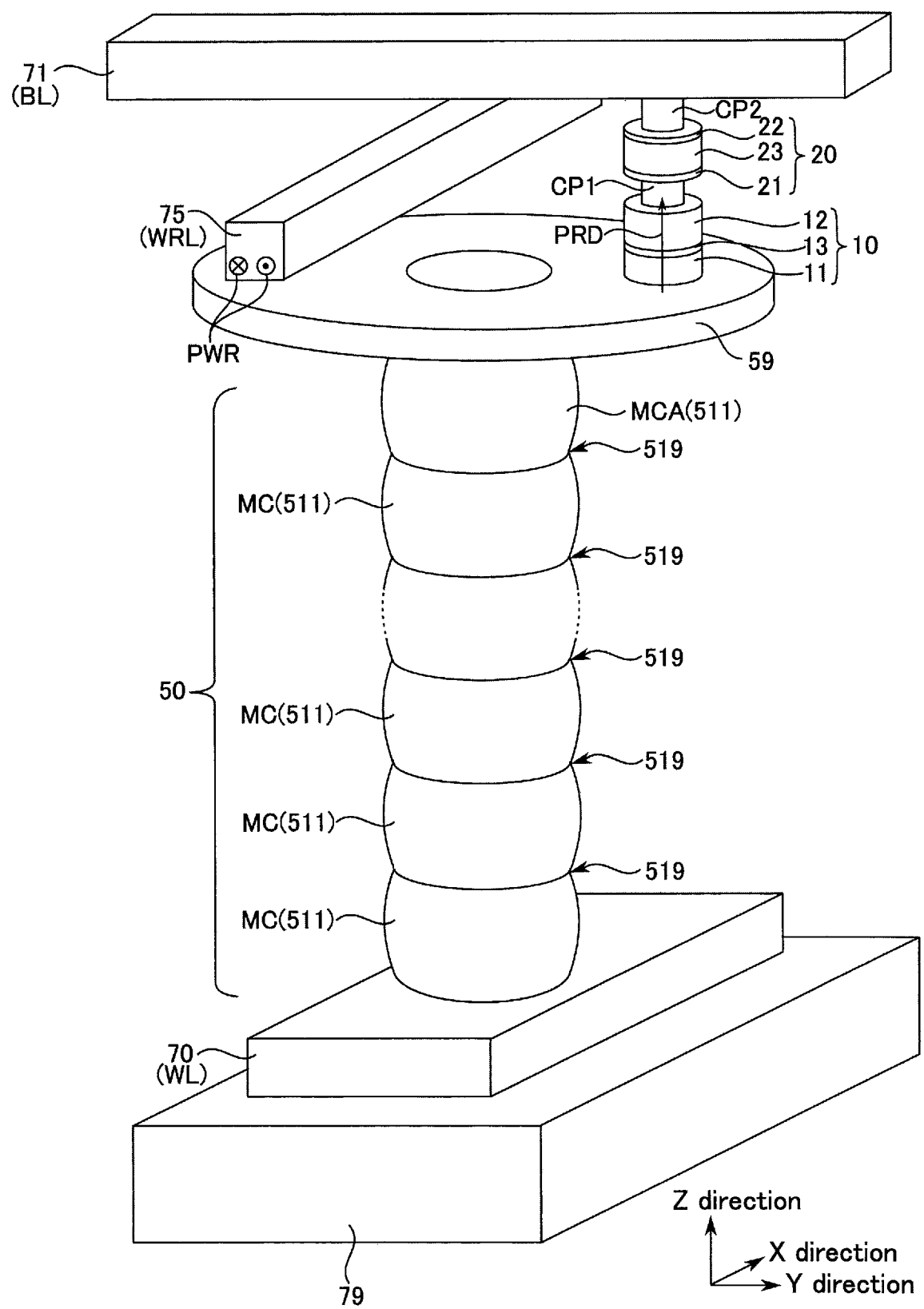
F I G. 3

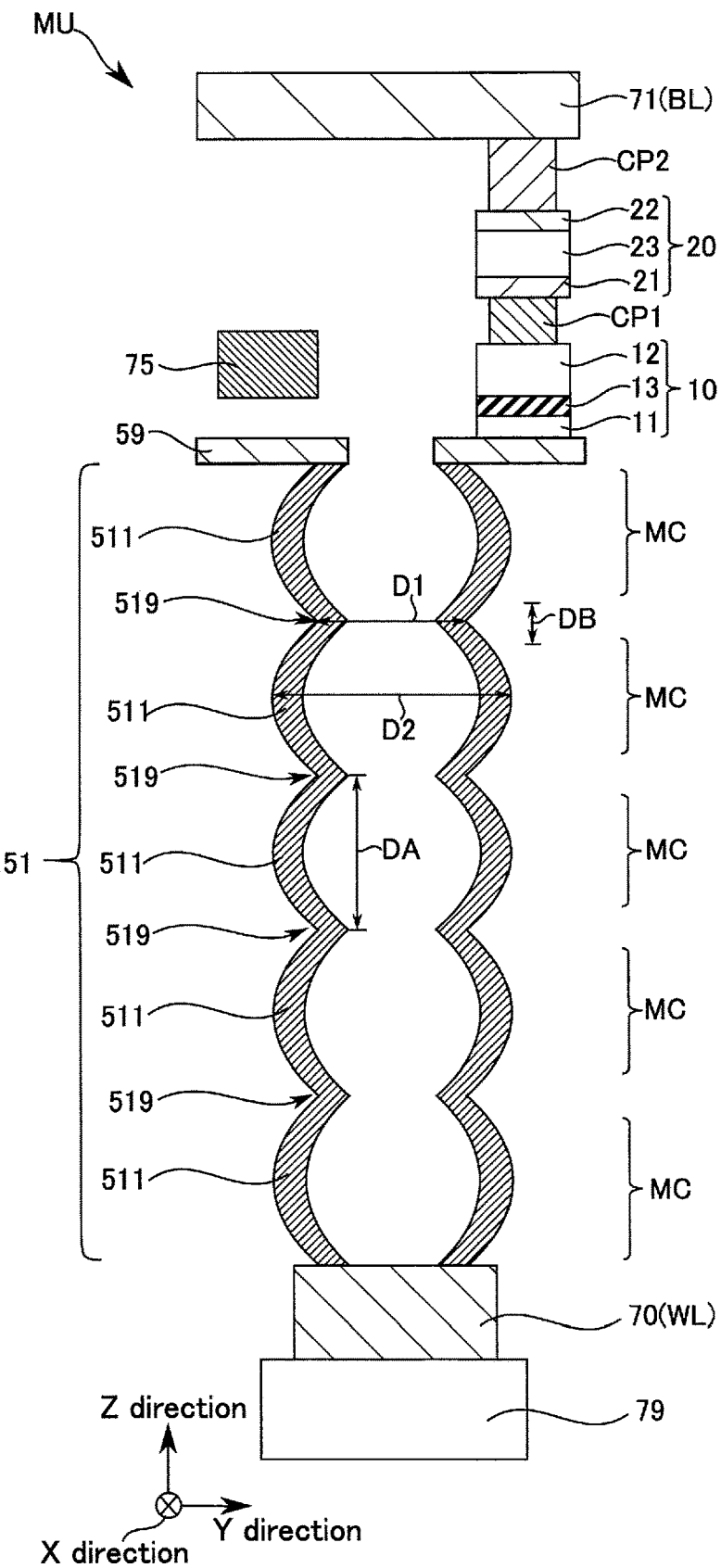
F I G. 4

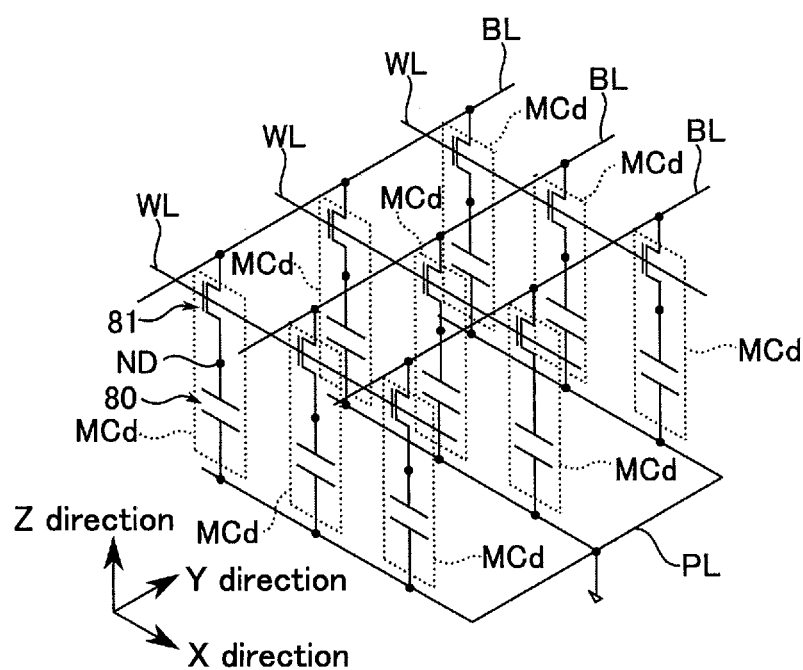
F I G. 18

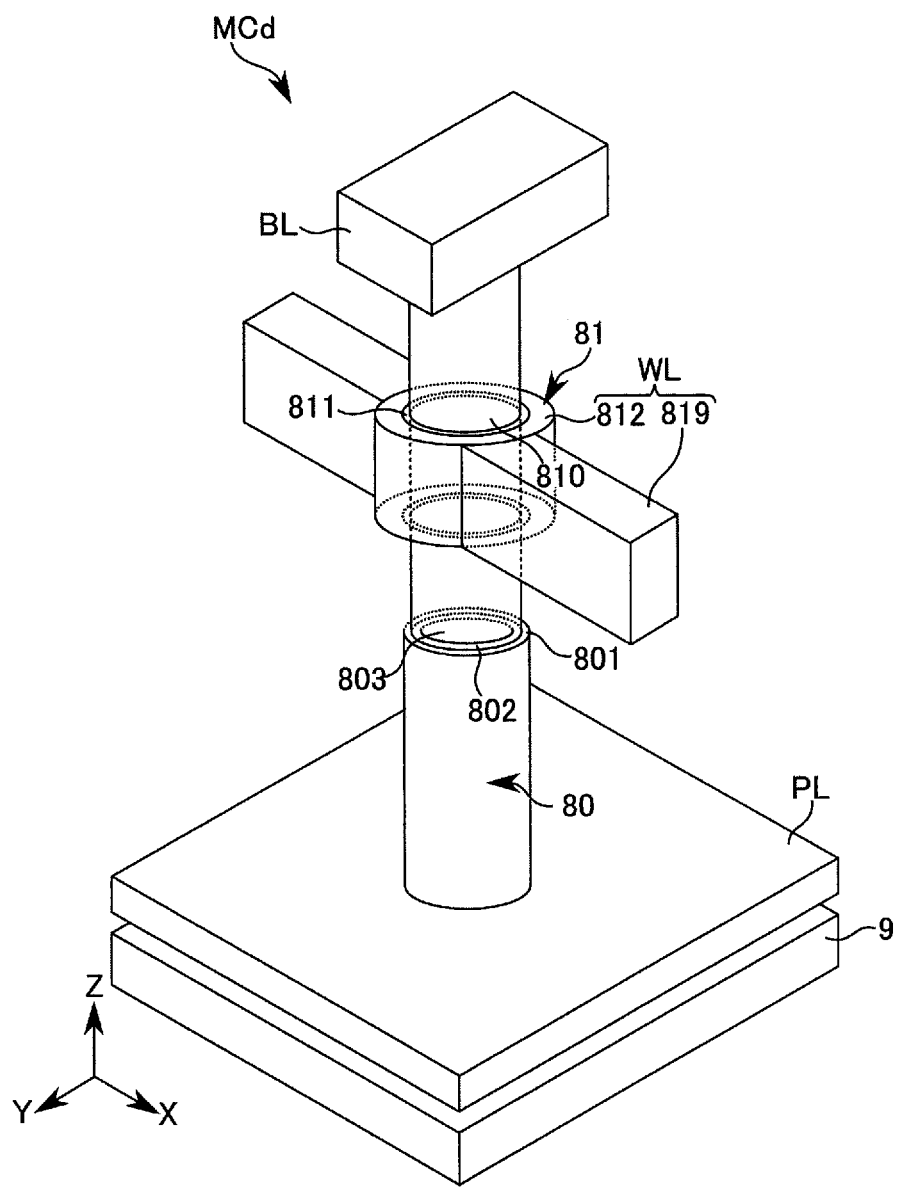
F I G. 19

MEMORY DEVICE HAVING MULTIPLE CHIPS AND METHOD FOR MANUFACTURING THE SAME

CROSS-REFERENCE TO RELATED APPLICATIONS

This application is based upon and claims the benefit of priority from Japanese Patent Application No. 2020-052006, filed Mar. 24, 2020, the entire contents of which are incorporated herein by reference.

FIELD

Embodiments described herein relate generally to a memory device and a method of manufacturing a memory device.

BACKGROUND

Research and development of memory devices with a novel configuration are promoted.

BRIEF DESCRIPTION OF THE DRAWINGS

FIG. 1 is a block diagram showing an exemplary configuration of a memory device of a first embodiment.

FIG. 3 is a diagram showing an exemplary configuration of the memory cell array of the memory device of the first embodiment.

FIG. 4 is a diagram showing an exemplary configuration of the memory cell array of the memory device of the first embodiment.

FIG. 18 is an equivalent circuit diagram of a memory cell array of the memory device of the second embodiment.

FIG. 19 is a bird's eye view showing an exemplary configuration of a memory cell of the memory device of the second embodiment.

DETAILED DESCRIPTION

Figure 2:
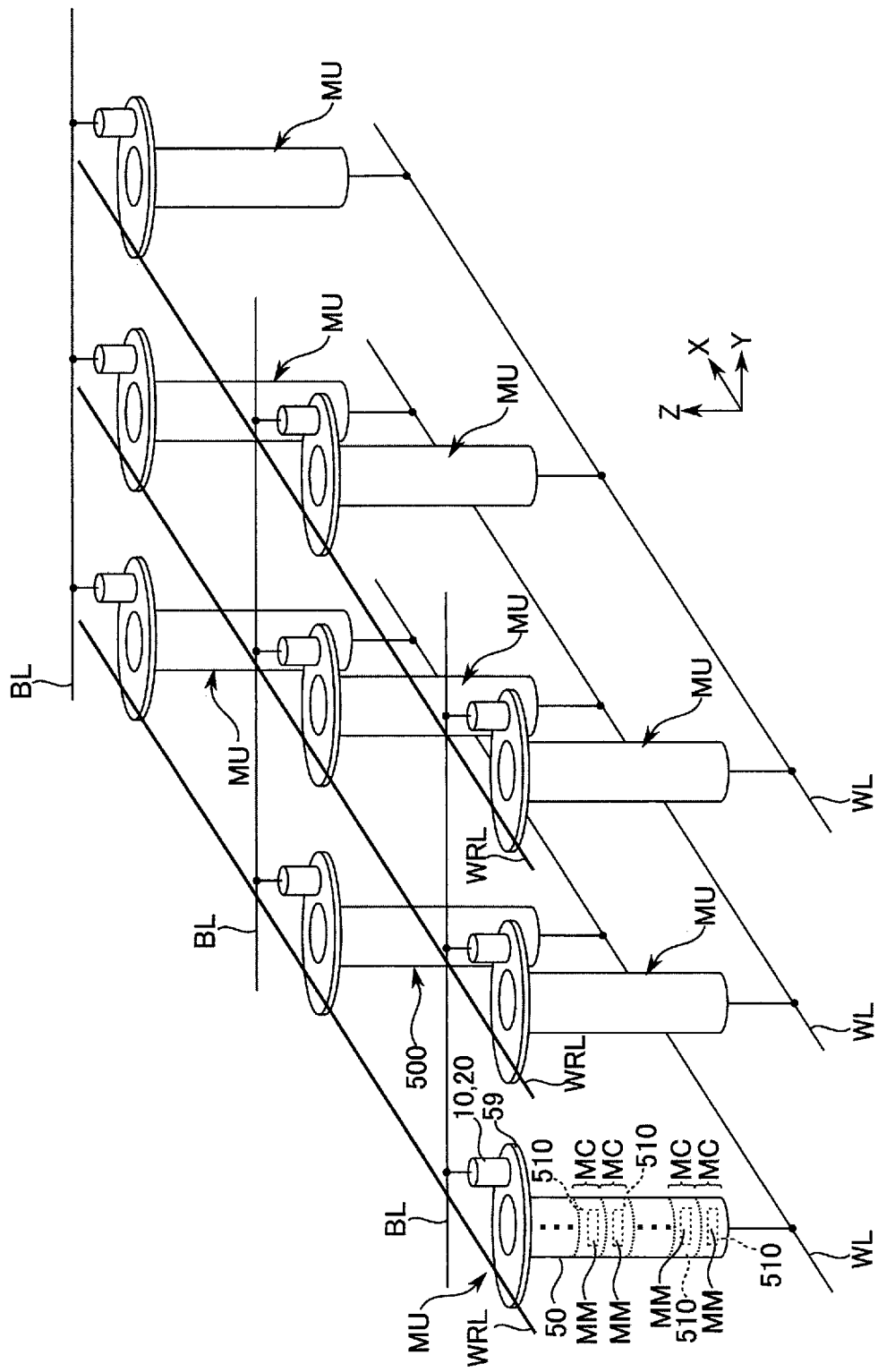
FIG. 2 is an equivalent circuit diagram of a memory cell array of the memory device of the first embodiment.

A memory device and a method of manufacturing the memory device according to each of first and second embodiments will be described with reference to FIGS. 1 through 28. The embodiments will be described in detail with reference to the drawings. In the following descriptions, the elements having the same function and configuration are denoted by the same reference numeral or sign.

If the elements denoted by reference signs having numerals or letters at their ends (e.g. circuit, interconnects, and various voltages and signals) need not be distinguished from one another, the numerals or letters will be excluded.

In general, according to one embodiment, a memory device includes: a first chip including a first insulating layer and a first pad; a plurality of memory units provided in a first area of the first insulating layer and arranged at first intervals in a first direction parallel to a surface of the first chip; a plurality of mark portions provided in a second area of the first insulating layer and arranged at second intervals in the first direction; a second chip including a second pad connected to the first pad and overlapping the first chip in a second direction perpendicular to the surface of the first chip; and a circuit provided in the second chip.

(1) First Embodiment

A memory device of the first embodiment and a method for manufacturing the memory device will be described with reference to FIGS. 1 through 16.

(1a) Exemplary Configuration

An exemplary configuration of the memory device of the first embodiment will be described with reference to FIGS. 1 through 6.

<Circuit Configuration>

FIG. 1 is a block diagram showing an exemplary configuration example of the memory device of the first embodiment.

The memory device of the first embodiment is, for example, a magnetic memory (for example, a domain wall memory).

FIG. 1 shows a domain wall memory (also called a domain wall shift memory) 1 including a memory cell array (also called a memory area) 100, a row control circuit 110, a column control circuit 120, a write circuit 140, a read circuit 150, a shift circuit 160, an I/O circuit 170, a voltage generation circuit 180, a control circuit 190, and the like.

The memory cell array 100 includes a plurality of magnetic bodies (magnetic members) 51 and a plurality of interconnects. Each of the magnetic bodies 51 is connected to its corresponding one or more interconnects (e.g., word lines and bit lines). Data is stored in a memory cell MC in each of the magnetic bodies 51.

The row control circuit 110 controls a plurality of rows of the memory cell array 100. The row control circuit 110 is supplied with an address decoding result (a row address). The row control circuit 110 sets a row (e.g., a word line) based on the address decoding result in a selected state. Hereinafter, the row (or word line) set in a selected state will be referred to as a selected row (or selected word line). Rows other than the selected row will be referred to as unselected rows (or unselected word lines).

The row control circuit 110 includes, for example, a multiplexer (a word line selection circuit) and a word line driver, and the like.

The column control circuit 120 controls a plurality of columns of the memory cell array 100. The column control circuit 120 is supplied with an address decoding result (a column address) from the control circuit 190. The column control circuit 120 sets a column (e.g., at least one bit line) based on the address decoding result in a selected state. Hereinafter, the column (or bit line) set in a selected state will be referred to as a selected column (or selected bit line). Columns other than the selected column will be referred to as unselected columns (or unselected bit lines).

The column control circuit 120 includes a multiplexer (a bit line selection circuit), a bit line driver, and the like.

The write circuit (also called a write control circuit or a write driver) 140 performs various types of control for write operation (writing of data). During write operation, the write circuit 140 supplies the memory cell array 100 with a write pulse formed by a current and/or a voltage. Accordingly, data is written to the memory cell array 100 (into the memory cell).

For example, the write circuit 140 is connected to the memory cell array 100 via the row control circuit 110.

The write circuit 140 includes a voltage source and/or a current source, a pulse generation circuit, a latch circuit, and the like.

The read circuit (also called a read control circuit or a read driver) 150 performs various types of control for read operation (reading of data). During read operation, the read circuit 150 supplies the memory cell array 100 with a read pulse (e.g., a read current). The read circuit 150 senses the potential or the current value of a bit line BL. Based on a result of the sensing, data is read from a magnetic body 51.

For example, the read circuit 150 is connected to the memory cell array 100 via the column control circuit 120.

The read circuit 150 includes a voltage source and/or a current source, a pulse generation circuit, a latch circuit, a sense amplifier circuit, and the like.

The shift circuit (also called a shift control circuit or a shift driver) 160 performs various types of control for shift operation (shifting of data). During shift operation, the shift circuit 160 supplies the memory cell array 100 with a pulse (referred to as a shift pulse hereinafter) to move a domain wall (magnetic domain) in a magnetic body 51.

For example, the shift circuit 160 is connected to the memory cell array 100 via the row control circuit 110 and the column control circuit 120.

The shift circuit 160 includes a voltage source and/or a current source, a pulse generation circuit, and the like.

Note that the write circuit 140, read circuit 150 and shift circuit 160 are not limited to circuits which are independent of one another. For example, these circuits may have a common structural element that is mutually usable and may be arranged in the domain wall memory 1 as a single integrated circuit.

The I/O circuit (input/output circuit) 170 is an interface circuit that transmits and receives a variety of signals.

During write operation, the I/O circuit 170 transfers data DT from an external device (controller or host device) 2 to the write circuit 140 as write data. During read operation, the I/O circuit 170 transfers data, which is output from the memory cell array 100 to the read circuit 150, to the external device 2 as read data. The I/O circuit 170 transfers an address ADR and a command CMD from the external device 2 to the control circuit 190. The I/O circuit 170 transmits and receives various control signals CNT to and from the control circuit 190 and the external device 2.

The voltage generation circuit 180 generates voltages for a variety of operations of the memory cell array 100 using a power supply voltage provided from the external device 2 (or a power supply). For example, during write operation, the voltage generation circuit 180 outputs various voltages generated for the write operation to the write circuit 140.

During read operation, the voltage generation circuit 180 outputs various voltages generated for the read operation to the read circuit 150. During shift operation, the voltage generation circuit 180 outputs various voltages generated for the shift operation to the shift circuit 160.

The control circuit (also called a state machine, a sequencer or an internal controller) 190 controls the operation of each circuit in the memory device 1 in response to the control signals CNT, address ADR and command CMD.

The control circuit 190 includes, for example, a command decoder, an address decoder and a latch circuit.

The command CMD is, for example, a signal indicative of an operation to be performed by the domain wall memory 1. The address ADR is, for example, a signal indicative of the coordinates of at least one memory cell (hereinafter referred to as a selected cell) to be operated in the memory cell array 100. The address ADR includes a row address and a column address of the selected cell. The control signals CNT are, for example, signals for controlling the operation timing between the magnetic memory 1 and the external device 2 and the internal operation timing of the magnetic memory 1.

FIG. 2 is a schematic diagram showing an exemplary configuration of a memory cell array in the domain wall memory of the first embodiment.

In the domain wall memory of the first embodiment, a plurality of magnetic bodies 51 are provided in the memory cell array 100, as shown in FIG. 2.

The magnetic bodies 51 are arranged in two dimensions in the memory cell array 100 in a substrate (not shown). Each of the magnetic bodies 51 extends in a direction (Z direction) perpendicular to the upper surface (X-Y plane) of the substrate. The Z direction is perpendicular to the X-Y plane. The Z direction intersects X and Y directions.

A plurality of word lines WL and a plurality of bit lines BL are provided in the memory cell array 100. The word lines WL are arranged in the Y direction. The word lines WL each extend in the X direction. The bit lines BL are arranged in the X direction. The bit lines BL each extend in the Y direction. The bit lines BL are provided above the word lines in the Z direction.

Each of the magnetic bodies 51 is provided between its corresponding word line WL and bit line BL. One end of the magnetic body 51 is connected to the word line WL. The other end of the magnetic body 51 is connected to the bit line BL.

The magnetic bodies 51 arranged in the X direction are connected to the same word line WL. The magnetic bodies 51 arranged in the Y direction are connected to the same bit line BL.

For example, a reading element 10 and a switching element 20 are connected between a bit line BL and a magnetic body 51.

The reading element 10 is provided between the magnetic body 51 and the switching element 20. The reading element 10 is electrically connected to the magnetic body 51 and the switching element 20. For example, the reading element 10 is connected to the magnetic body 51 via a magnetic layer 59.

During read operation of the domain wall memory 1, the reading element 10 functions as an element that reads data from the magnetic body 51 (also referred to as a reproducing element hereinafter).

The switching element 20 is provided between the reading element 10 and the bit line BL. The switching element 20 is electrically connected to the reading element and the bit line.

The switching element 20 is used to control the connection between the magnetic body 51 and the bit line BL.

When the switching element 20 is turned on, the magnetic body 51 is electrically connected to the bit line BL. When the switching element 20 is turned off, the magnetic body 51 is electrically disconnected from the bit line BL.

For example, the on/off of the switching element 20 is controlled under the control of a difference in potential between the bit line BL and the word line WL. Accordingly, at least one magnetic body to be operated is selected from among the magnetic bodies 51 of the memory cell array 100.

A conductive layer (interconnect) WRL is provided above the magnetic layer 59 in the Z direction. The conductive layer WRL extends in the X direction, for example, in an area between the bit line BL and the magnetic layer 59. The conductive layer WRL is provided across a plurality of magnetic layers 59.

The conductive layer WRL is an interconnect for writing data by the magnetic field writing method during write operation of the domain wall memory 1 (also referred to as a write interconnect hereinafter). During write operation of the magnetic field writing method, a write pulse (also referred to as a write current hereinafter) is supplied to the write interconnect WRL. The write current generates a magnetic field around the write interconnect WRL. The magnetic field is applied to the magnetic layer 59. In accordance with the direction of the magnetic field, the directions of magnetization of the magnetic layer 59 and magnetization MM of the magnetic body 51 connected to the magnetic layer 59 are set. Accordingly, data is written to the magnetic body 51.

The direction of the magnetic field varies with the direction in which a write current flows through the write interconnect WRL. Therefore, the direction in which a write current flows through the write interconnect WRL is set in accordance with data to be written.

A plurality of memory cells MC are provided in each of the magnetic bodies 51. The memory cells MC are arranged in the Z direction in the magnetic body 51. Thus, the memory cells MC are arranged in three dimensions in the memory cell array 100.

Each of the memory cells MC includes a cell portion (also referred to as a memory portion, a data retention portion or a cell area hereinafter) 511. The cell portion 511 is an area (part) provided in the magnetic body 51 so as to correspond to a memory cell MC. The cell portion 511 is a magnetic area (magnetic portion) that may have magnetization MM.

When a memory cell MC retains data, the cell portion 511 has magnetization MM. The data stored in the memory cell MC is associated with the direction of the magnetization MM of the cell portion 511.

The magnetic body 51 has perpendicular magnetic anisotropy or in-plane magnetic anisotropy. The direction of magnetization easy axis of the cell portion 511 corresponds to the magnetic anisotropy of the magnetic body 51.

Hereinafter, the configuration including at least one memory cell MC in a magnetic body 51, a reading element 10 and a switching element 20 will be referred to as a memory cell unit (or memory cell string).

<Memory Cell Unit>

FIG. 3 is a schematic bird's eye view showing an exemplary configuration of the memory cell unit in the domain wall memory of the first embodiment. FIG. 4 is a schematic sectional view showing an exemplary configuration of the memory cell unit in the domain wall memory of the first embodiment.

As shown in FIGS. 3 and 4, the magnetic body 51 is provided above a substrate (also referred to as a base layer hereinafter) 79 in the Z direction. The magnetic body 51 includes a magnetic layer (also referred to as a domain wall movement layer). The magnetic body 51 is a magnetic layer having a cylindrical structure extending in the Z direction. For example, the magnetic body 51 is sandwiched between two insulators (not shown) in a direction parallel to the upper surface of the substrate 79. Note that an area surrounded by the cylindrical magnetic body 51 may be provided with an air gap without being filled with the insulators.

For example, the materials of the magnetic body 51 include at least one element selected from the group consisting of cobalt (Co), iron (Fe), nickel (Ni), manganese (Mn) and chromium (Cr) and at least one element selected from the group consisting of platinum (Pt), palladium (Pd), iridium (Ir), ruthenium (Ru) and rhodium (Rh). More specifically, the materials of the magnetic body 51 are CoPt, CoCrPt, FePt, CoPd, FePd and the like. Note that the materials of the magnetic body 51 are not limited to the above materials, but may include other magnetic materials.

The magnetic layer 59 is provided to overlap the magnetic body 51 in the Z direction. For example, the magnetic layer 59 has a circular planar shape when viewed from the Z direction. However, the magnetic layer 59 may have a rectangular planar shape. The dimension of the magnetic layer 59 in a direction parallel to the surface of the substrate 79 is greater than dimension D3 of the magnetic body 51 in the direction parallel to the surface of the substrate 79.

The magnetic layer 59 is connected to the magnetic body 51. For example, the magnetic layer 59 is a layer that is continuous with the magnetic body 51.

The magnetization of the magnetic layer 59 varies according to that of the magnetic body 51. For example, the magnetization direction of the magnetic layer 59 is the same as that of the cell portion 511 directly connected to the magnetic layer 59. The cell portion 511 directly connected to the magnetic layer 59 corresponds to one (MCA) of the memory cells in the memory cell unit MU, which is located closest to the bit line.

The memory cell MCA functions as a read cell during read operation and functions as a write cell during write operation. The read cell is a memory cell which temporarily retains data from a read-target memory cell during read operation. The write cell is a memory cell to which write data is temporarily written during write operation.

A stacked body including the reading element 10 and the switching element 20 is provided on the magnetic layer 59.

The reading element 10 is a magnetoresistive effect element.

The magnetoresistive effect element 10 is provided to overlap the magnetic layer 59 in the Z direction. For example, the magnetoresistive effect element 10 is disposed so as not to overlap the magnetic body 51 in the Z direction. The magnetoresistive effect element 10 is disposed on one end side of the magnetic layer 59 in the Y direction.

The magnetoresistive effect element 10 is electrically connected to the magnetic layer 59.

For example, the magnetoresistive effect element 10 includes two magnetic layers 11 and 12 and a nonmagnetic layer 13. The nonmagnetic layer 13 is provided between the two magnetic layers 11 and 12 in the Z direction. The two magnetic layers 11 and 12 and the nonmagnetic layer 13 form a magnetic tunnel junction (MTJ). Hereinafter, the magnetoresistive effect element 10 including a magnetic tunnel junction will be referred to as an MTJ element. The nonmagnetic layer 13 of the MTJ element 10 will be referred to as a tunnel barrier layer.

The magnetic layers 11 and 12 are each a ferromagnetic layer including cobalt, iron, boron and the like. The magnetic layers 11 and 12 each may be a single-layer film or a multilayer film (e.g., an artificial lattice film). The tunnel barrier layer 13 is, for example, an insulating film including magnesium oxide. The tunnel barrier layer may be a single-layer film or a multilayer film.

The magnetic layers 11 and 12 each have in-plane or perpendicular magnetic anisotropy.

The magnetization easy axis direction of the magnetic layers 11 and 12 having in-plane magnetic anisotropy is substantially parallel to the layer surface (film surface) of the magnetic layers. In this case, each of the magnetic layers 11 and 12 has magnetization substantially parallel to the layer surface of the magnetic layer. The magnetization direction of the magnetic layers 11 and 12 having in-plane magnetic anisotropy is perpendicular to the arrangement direction (Z direction) of the magnetic layers 11 and 12.

The magnetization easy axis direction of the magnetic layers 11 and 12 having perpendicular magnetic anisotropy is substantially perpendicular to the layer surface (film surface) of the magnetic layers. In this case, each of the magnetic layers 11 and 12 has magnetization substantially perpendicular to the layer surface of the magnetic layer. The magnetization direction of the magnetic layers 11 and 12 having perpendicular magnetic anisotropy is parallel to the arrangement direction (Z direction) of the magnetic layers 11 and 12.

The magnetization direction of the magnetic layer 11 is variable. The magnetization direction of the magnetic layer 12 is invariable (fixed). Hereinafter, the magnetic layer 11 whose magnetization direction is variable will be referred to as a storage layer. Hereinafter, the magnetic layer 12 whose magnetization direction is invariable (fixed) will be referred to as a reference layer. Note that the storage layer 11 may be called a free layer, a magnetization free layer, or a magnetization variable layer. The reference layer 12 may be called a pin layer, a pinned layer, a magnetization invariable layer, or a magnetization fixed layer.

The magnetization direction of the storage layer 11 and that of the magnetic layer 59 vary in conjunction with each other. For example, the magnetization direction of the storage layer 11 is the same as that of the magnetic layer 59.

Note that the magnetic layer 59 may be used as a storage layer of the MTJ element 10. In this case, the nonmagnetic layer 13 is provided on the magnetic layer 59 such that the nonmagnetic layer 13 is brought into direct contact with the magnetic layer 59 without forming the magnetic layer 11.

In the first embodiment, "the magnetization direction of the reference layer (magnetic layer) is invariable or fixed" means that when a current, a voltage or magnetic energy (e.g., a magnetic field) which varies the magnetization direction of the storage layer is supplied to the magnetoresistive effect element 10, the magnetization direction of the reference layer does not vary before or after the supply of the current, voltage or magnetic energy.

The switching element 20 is provided above the MTJ element 10 in the Z direction.

The switching element 20 is electrically connected to the MTJ element 10 through, for example, a contact plug CP1 (or a conductive layer). The switching element 20 may be directly connected to the MTJ element 10 but not through any other member.

The switching element 20 includes, for example, two electrodes 21 and 22 and a switching layer 23. The switching layer 23 is provided between the two electrodes 21 and 22. The electrode 21 is provided on the contact plug CP1 in the Z direction. The switching layer 23 is provided on the electrode 21 in the Z direction. The electrode 22 is provided on the switching layer 23 in the Z direction. The material of the switching layer 23 is a transition metal oxide, a chalcogenide compound or the like.

The switching element 20 switches an electrical connection between the memory cell unit MU and the bit line BL. As a result, the activation/deactivation (select/nonselection) of the memory cell unit MU can be controlled.

The resistance state of the switching layer 23 changes to a high resistance state or a low resistance state according to the supplied current (or voltage).

Thus, the switching element 20 is set in an ON state (a low resistance state, a conduction state) when the memory cell unit MU is supplied with a current that is equal to or larger than the threshold current of the switching element 20 (or a voltage that is higher than the threshold voltage of the switching element 20). The switching element 20 is set in an OFF state (a high resistance state, a nonconduction state) when the memory cell unit MU is supplied with a current that is smaller than the threshold current of the switching element 20.

The switching element 20 in an OFF state electrically separates the memory cell unit MU from the bit line BL.

The switching element 20 in an ON state can cause a current to flow through the memory cell MC. The switching element 20 in an ON state supplies the memory cell unit MU with a current flowing from the bit line BL toward the word line WL or a current flowing from the word line WL toward the bit line BL in accordance with a difference in potential between the bit line BL and the word line WL. As described above, the switching element 20 is an element capable of causing a current to flow through the memory cell unit MU bidirectionally.

The conductive layer 70 is provided between the magnetic body 51 and the substrate 79. The conductive layer 70 is provided on an insulating layer (not shown) covering the upper surface of the substrate 79. The conductive layer 70 extends in the X direction. Note that a magnetic layer or a conductive layer may be provided between the conductive layer 70 and the magnetic body 51. The conductive layer 70 is used as a word line WL. The conductive layer 70 as a word line WL is electrically connected to the row control circuit 110. The activation/deactivation (selection/nonselection) of the word line WL is controlled by the row control circuit 110.

The conductive layer 71 is provided above the switching element 20 in the Z direction. The conductive layer 71 is electrically connected to the switching element through a contact plug CP2. The conductive layer 71 extends in the Y direction.

The conductive layer 71 is used as a bit line BL. The conductive layer 71 as a bit line BL is electrically connected to the column control circuit 120. The activation/deactivation (selection/nonselection) of the bit line BL is controlled by the column control circuit 120.

A conductive layer 75 is provided in an insulating layer 98 between the magnetic layer 59 and the bit line BL. The conductive layer 75 is adjacent to the stacked body including the MTJ element 10 and the switching element 20 in the Y direction. The conductive layer 75 extends in the X direction.

The conductive layer 75 is used as a write interconnect WRL. The conductive layer 75 as a write interconnect is electrically connected to the row control circuit 110 and the write circuit 140. The activation/deactivation of the write interconnect 75 is controlled by the row control circuit 110. The supply of write current PWR to the write interconnect WRL is controlled by the write circuit 140.

In the domain wall memory of the first embodiment, as shown in FIGS. 3 and 4, the dimension of the magnetic body 51 (e.g., the diameter of the cylindrical magnetic layer) in a direction parallel to the upper surface of the substrate 79 (X or Y direction) varies periodically along the Z direction. The magnetic body 51 is constricted at predetermined intervals (periods) in the Z direction.

In the first embodiment, the structure with periodic variations in dimension (periodic constriction) is called a constricted structure. The constricted structure includes a plurality of constricted portions.

Hereinafter, constricted portions 519 of the magnetic body 51 will also be referred to as concave portions 519.

A range (area) including the concave portions 519 with certain dimensions in the Z direction is called a constricted area (or a domain wall existing area). For example, the constricted area has a certain range centered around the concave portions 519. The concave portions 519 each have a certain dimension DB. Therefore, the constricted area may be considered to be the concave portions 519.

The dimension (diameter of the cylindrical portion) D1 of each concave portion 519 in a direction parallel to the upper surface of the substrate (X or Y direction) is smaller than that of a portion other than the concave portion 519 in the constricted area.

The dimension D1 is the minimum dimension of the magnetic body 51 having a constricted structure in the X direction (or Y direction).

The magnetic body 51 includes a plurality of portions 511. Each of the portions 511 is provided between two concave portions 519 arranged in the Z direction. The portions 511 protrude from outside the cylindrical magnetic body in a direction parallel to the upper surface of the substrate 79 relative to the concave portions 519. Hereinafter, the portions 511 will be referred to as convex portions 511.

The convex portions 511 substantially correspond to the cell portions of the memory cell MC.

The convex portions 511 are each provided in an area (range) between two concave portions 519 of the magnetic body 51. Hereinafter, the area (range) between the two concave portions 519 will be referred to as a cell area (magnetized area or domain wall movement area).

Each of the convex portions 511 is provided between two concave portions (constricted areas) 519 in the Z direction. Each of the concave portions (constricted areas) 519 substantially corresponds to a boundary portions of adjacent memory cells MC in the Z direction.

The convex portions 511 each have a dimension (diameter of the cylindrical portion) D2 in a direction parallel to the upper surface of the substrate 79 (X or Y direction). The dimension D2 is larger than the dimension D1 of the concave portion 519. For example, the dimension D2 is the maximum dimension of the magnetic body 51 having a constricted structure in the X direction (or Y direction).

The dimension of each convex portion (cell area) 511 in the X direction (or Y direction) gradually decreases from the central part of the convex portion 511 toward the concave portions 519. The volume of the magnetic body (magnetic layer) of the concave portion 519 is smaller than that of the magnetic body of the convex portion 511.

Each convex portion (cell area) 511 in one magnetic body 51 may have magnetization (a magnetic domain).

For example, the magnetic body 51 has perpendicular magnetic anisotropy. The film surface (layer surface) of the cylindrical magnetic body 51 is in the direction along the Z direction. Thus, the magnetization easy axis direction of the magnetic body 51 having perpendicular magnetic anisotropy intersects with the Z direction. When the magnetic body 51 has perpendicular magnetic anisotropy, for example, a magnetic layer having perpendicular magnetic anisotropy is used for the magnetic layers 11 and 12 of the MTJ element 10. In this case, however, a magnetic layer having an in-plane magnetic anisotropy may be used for the magnetic layers 11 and 12 of the MTJ element 10.

Note that the magnetic body 51 may have in-plane magnetic anisotropy. In this case, the magnetization easy axis direction of the magnetic body 51 is parallel to the Z direction. When the magnetic body 51 has in-plane magnetic anisotropy, for example, a magnetic layer having in-plane magnetic anisotropy is used for the magnetic layers 11 and 12 of the MTJ element 10. In this case, however, a magnetic layer having perpendicular magnetic anisotropy may be used for the magnetic layers 11 and 12 of the MTJ element 10.

<Exemplary Configuration>

Figure 5:
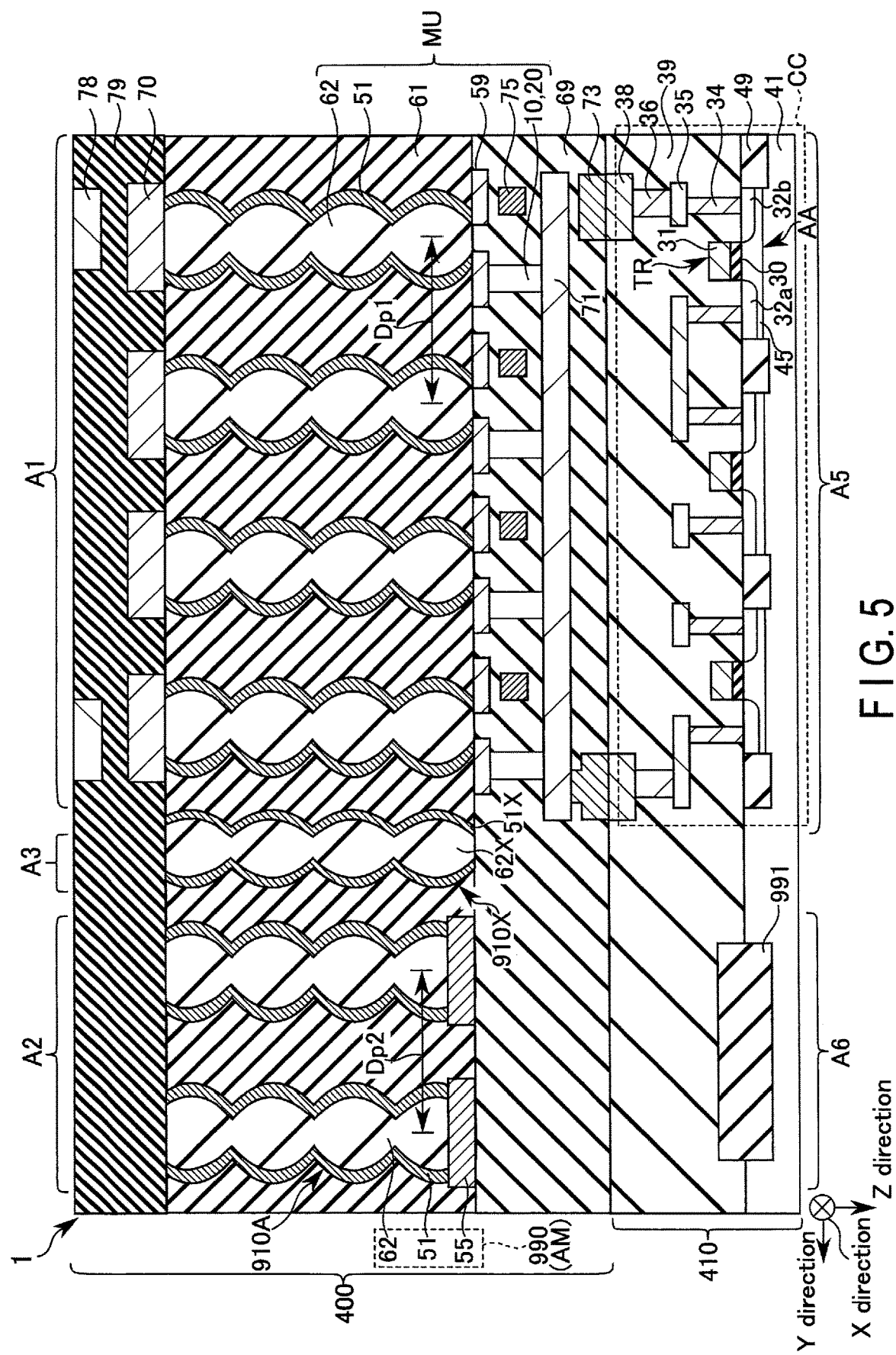
FIG. 5 is a sectional view showing an exemplary configuration of the memory device of the first embodiment.

FIG. 5 is a sectional view showing an exemplary configuration of the magnetic memory of the first embodiment. FIG. 5 shows a section (Y-Z section) of the domain wall memory of the first embodiment, taken along the Y direction.

Figure 6:
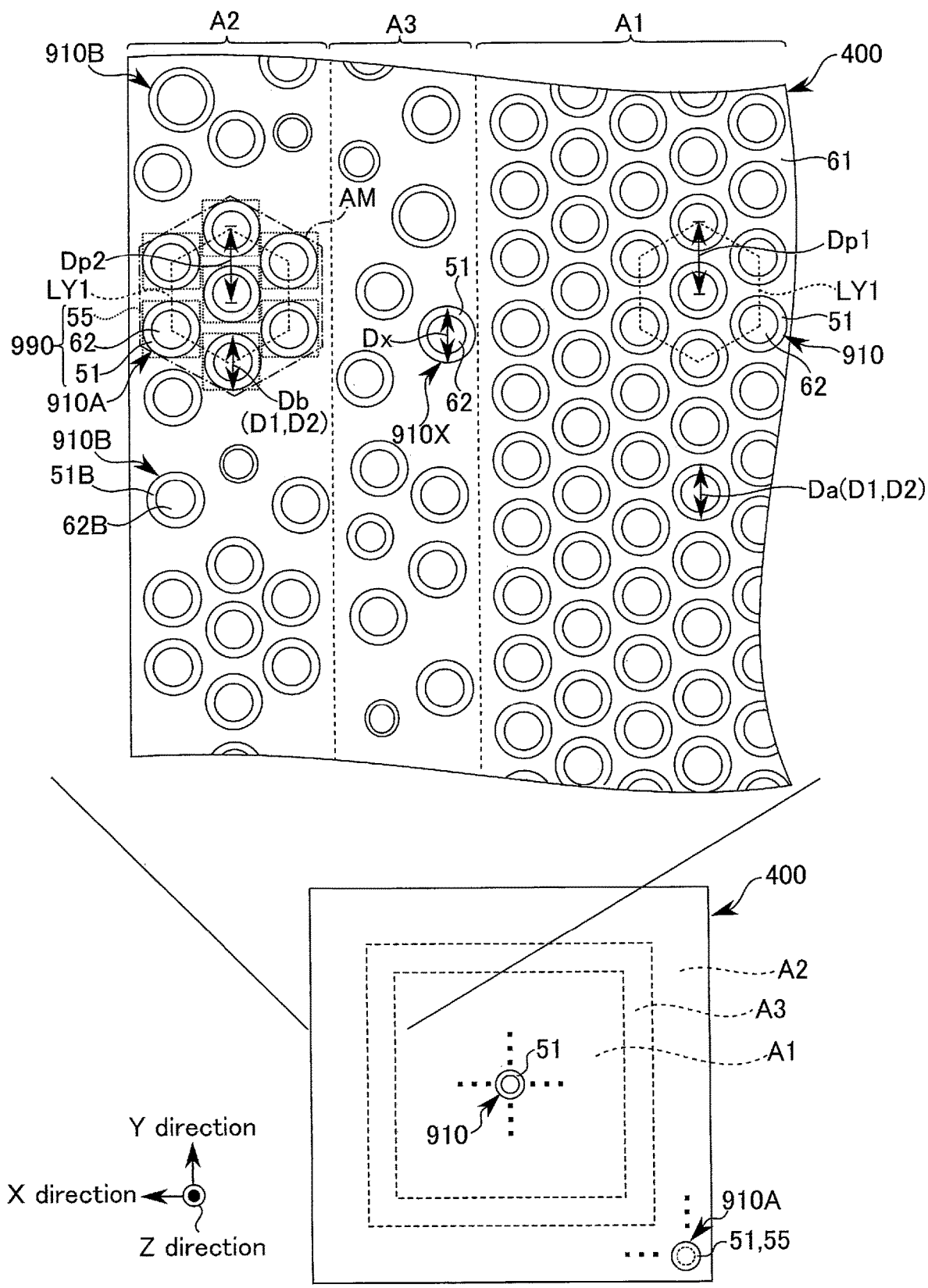
FIG. 6 is a top view showing an exemplary configuration of the memory device of the first embodiment.

FIG. 6 is a top view (plan view) showing an exemplary configuration of the magnetic memory of the first embodiment.

As shown in FIG. 5, the magnetic memory of the first embodiment has a bonding structure of two chips.

In the first embodiment, a chip 400 including a memory cell array (also referred to as a memory cell array chip hereinafter) is bonded to a chip 410 including a memory control circuit CC (also referred to as a memory control circuit chip hereinafter).

The memory cell array chip 400 overlies the memory control circuit chip 410 in the Z direction.

The memory control circuit chip 410 includes a plurality of field effect transistors (also referred to simply as transistors) TR. The transistors TR constitute each of circuits 110 to 190 other than the memory cell array of the magnetic memory 1. The transistors TR are provided in an area (hereinafter referred to as a circuit area) A5 of the chip 410.

The transistors TR are arranged in an active area AA in a semiconductor substrate (e.g., a silicon substrate) 41. The active area AA is a semiconductor region isolated by element isolation regions (insulating layers 49) in the silicon substrate 41.

A well region 45 of a certain conductivity type is provided in the active area AA. The transistors TR are provided in the well region 45.

A gate electrode 31 of each transistor TR is provided above the well region 45 with a gate insulating layer 30 therebetween. The source/drain regions 32a and 32b of the transistor TR are provided in the well region 45. The source/drain regions 32a and 32b sandwich a channel region of the transistor TR in a direction parallel to the upper surface of the substrate 41. The gate electrode 31 is opposed to the channel region with the gate insulating layer 30 therebetween.

The gate electrode 31 of the transistor TR is covered with an interlayer insulating layer 39 on the silicon substrate 41. A plurality of plugs 34 and 36, a conductive layer (interconnect) 35 and a pad 38 are provided in the interlayer insulating layer 39.

The plug (contact portion) 34 is provided on the source/drain region 32 (32a, 32b). The conductive layer (intermediate interconnect) 35 is connected to the source/drain region 32 via the plug 34. The plug (contact portion) 36 is provided on the conductive layer 35. The pad 38 is connected to the conductive layer 35 via the plug 36.

For example, the memory control circuit chip 410 includes an area (referred to as an alignment mark area hereinafter) A6 provided with an alignment mark 991. The alignment mark area A6 is adjacent to a circuit area A5 in a direction parallel to the surface of the chip 410.

The memory cell array chip 400 is provided above the memory control circuit chip 410 in the Z direction.

The memory cell array chip 400 includes a plurality of memory cell units MU as described above (see FIGS. 3 and 4).

Each of the memory cell units MU includes a plurality of magnetic bodies 51. The magnetic bodies 51 are provided in an insulating layer 61.

As shown in FIG. 5, an area A1 including a plurality of memory cell units MU (referred to as a memory cell array area hereinafter) is provided in the memory cell array chip (also referred to as an alumina plate hereinafter) 400.

In the memory cell array area A1, the magnetic bodies 51 are provided in holes 910 in the insulating layer 61. For example, the insulating layer 61 is an aluminum oxide layer (e.g., a porous alumina layer). Hereinafter, the holes 910 in the alumina layer 61 will be referred to as alumina holes 910.

In each alumina hole 910, the magnetic body 51 is provided between the alumina layer 61 and an insulating layer 62.

The magnetic bodies 51 extend in the Z direction. The magnetic bodies 51 are each shaped like a cylinder. The magnetic bodies 51 are periodically constricted in the Z direction. The dimension (diameter) of each magnetic body 51 in a direction parallel to the surface of the chip periodically varies along the Z direction.

In the memory cell array area. A1, the alumina holes 910 (members 51 and 62 in the holes) are arranged at predetermined pitches Dp1. Each pitch Dp1 is an interval between the centers of two alumina holes 910 in a direction (e.g., Y direction) parallel to the surface (upper surface) of the chip 400.

The reading element 10 and switching element 20 of the memory cell unit MU are provided between the magnetic body 51 and the memory control circuit chip 410 in the Z direction. The reading element 10 is connected to the magnetic body 51 via the magnetic layer 59. The reading element 10 is connected to a interconnect 71 (bit line BL) via the switching element 20. The write interconnect 75 (WRL) is provided between the magnetic layer 59 and the interconnect 71 in the Z direction. The reading element 10, switching element 20 and interconnects 71 and 75 are covered with an interlayer insulating layer 69. The interlayer insulating layer 69 is provided between the alumina layer 61 and the interlayer insulating layer 39 in the Z direction.

The reading element 10, switching element 20 and interconnects 71 and 75 are provided below the memory cell MC and above the memory control circuit chip 410 in the Z direction.

A plurality of pads 73 are provided below the interconnect 71 in the Z direction. The pads 73 are connected to an interconnect (e.g., interconnect 71) in the memory cell array chip 400. The pads 73 are provided on a first surface (also referred to as a bonding surface) of the memory cell array chip 400.

One or more of the pads 73 are each in direct contact with the pad 38 of the memory control circuit chip 410. Each memory cell unit MU is connected to a transistor TR (circuit) in the memory control circuit chip 410 via a pad 73.

The pads 73 and 38 function as pads for bonding the chips 400 and 410 (referred to as bonding pads hereinafter). For example, the chips 400 and 410 are bonded together by covalent bonding between the pads 38 and 73 and/or between the insulating layers 39 and 69.

Note that at least one of the pads 73 need not be connected to any components in the memory cell array chip 400 and at least one of the pads 38 need not be connected to any components in the memory control circuit chip 410.

A plurality of pads 78 and interconnects (e.g., word lines) 70 are provided on the surface (second surface of the memory cell array chip) opposed to the surface provided with the bonding pads 73. The interlayer insulating layer 79 covers the second surface of the memory cell array chip 400.

The interconnects 70 are each connected to its corresponding magnetic body 51. The interconnects 70 are covered with the interlayer insulating layer 79. The pads 78 each function as an external connection terminal for connecting the magnetic memory to another device. The pads 78 are electrically connected to the interconnects (e.g., interconnects 70) in the magnetic memory.

Note that the memory control circuit chip 410 may be provided with an external connection terminal (not shown).

In the first embodiment, an area A2 including an alignment mark (referred to as an alignment mark area hereinafter) is provided at an end of the memory cell array chip (alumina plate) 400. The alignment mark area A2 is opposed to the alignment mark area A6 of the memory control circuit chip 410 in the Z direction.

In the alignment mark area A2, an alumina hole 910A is provided in the alumina layer 61. For example, in the alignment mark area A2, the alumina hole 910A includes substantially the same as the members 51 and 62 in the alumina hole 910 of the memory cell array area A1. For example, in the alignment mark area A2, conductive layers 55 are provided to overlap the members 51 and 62 in the Z direction. The conductive layers 55 are provided on that side of the memory cell array chip 400 which is provided with the bonding pads 73.

A mark portion (mark member) 990 is provided in the alumina hole 910A of the alignment mark area A2. For example, the mark portion 990 includes the magnetic body 51, insulating layer 62 and conductive layer 55. The alignment mark AM is formed using one or more mark portions 990.

In the first embodiment, alignment between members (e.g., alignment between a mask and a substrate during lithography) in a certain step at the time of forming the memory cell array chip 400 is performed using the alignment mark. AM of the memory cell array chip 400.

When two chips (wafers) are bonded together, alignment of the chips (wafers) is performed using the alignment mark AM of the memory cell array chip 400 and the alignment mark 991 of the memory control circuit chip 410.

In the alignment mark area A2, a plurality of alumina holes 910 A (members 51 and 62 in the holes 910A) are arranged at predetermined pitches Dp2. Each pitch Dp2 is an interval between the centers of two alumina holes 910A in a direction (e.g., Y direction) parallel to the surface (supper surface) of the chip 400.

For example, the pitch Dp2 is the same as the pitch Dp1. However, the pitch Dp2 may be different from the pitch Dp1.

For example, in the memory cell array chip 400, at least one alumina hole 910X is provided in an area A3 between the memory cell array area A1 and the alignment mark area A2.

The configuration of the alignment mark area will be described with reference to FIG. 6.

FIG. 6 is a top view showing an exemplary configuration of the memory cell array chip (alumina plate) in the magnetic memory of the first embodiment. FIG. 6 shows a plane in which alumina holes 910 and 910A are formed in the Z direction of the memory cell array chip 400.

As shown in FIG. 6, the memory cell array area A1 is provided in the memory cell array chip 400.

The magnetic body 51 of the memory cell unit MU is provided in the memory cell array area A1. The magnetic body 51 is provided in the hole (alumina hole) 910 in the alumina layer 61.

The alumina holes 910 and magnetic bodies 51 are arranged in the memory cell array area A1 in a hexagonal lattice when viewed from the Z direction, for example. The hexagonal lattice arrangement is a layout in which components that form one lattice are arranged at the apexes of a hexagon and around the center thereof.

The alumina holes 910 and magnetic bodies 51 are arranged regularly at certain pitches Dp1. For example, each pitch Dp1 is an interval between the centers of adjacent two alumina holes in the Y direction when the chip 400 is viewed from the Z direction.

FIG. 6 shows the pitch Dp1 of the alumina holes (magnetic bodies) in the Y direction in the memory cell array area A1. With respect to the alumina holes 910 in the memory cell array area A1, however, the pitch of two alumina holes 910 arranged in the X direction and the pitch of two alumina holes 910 arranged obliquely to the X-Y plane are each set to a predetermined size.

The alumina holes 910 each have a dimension. Da (a dimension from dimension D1 to dimension D2) in a direction parallel to the X-Y plane. The alumina holes 910A have substantially the same dimension Db.

The alignment mark area A2 is provided in the chip 400 so as to be adjacent to the memory cell array area A1 in a direction parallel to the upper surface of the chip 400. For example, the alignment mark area A2 surrounds the memory cell array area A1 in the direction parallel to the top surface of the chip 400. The alignment mark area A2 is a rectangular ring-shaped area.

For example, the alignment mark area A2 is provided in a dicing area of a wafer for forming the memory cell array chip (alumina plate) 400. The memory cell array chip 400 is cut out of a wafer by dicing the wafer.

In the alignment mark area A2, a plurality of alumina holes 910A and a plurality of magnetic bodies 51 are arranged in a hexagonal lattice when viewed from the Z direction, for example, like the alumina holes 910 and magnetic bodies 51 in the memory cell array area A1.

A magnetic body 51 and an insulating layer 62 are provided in each of the alumina holes 910A. The internal components of the alumina holes 910A are substantially the same as those of the alumina holes 910. In the alignment mark area A2, however, in order to improve alignment accuracy, the conductive layers 55 may be provided to overlap the alumina holes 910A (magnetic bodies 51 and insulating layers 62) in the Z direction.

For example, a conductive layer 55, a magnetic body 51 and an insulating layer 62 constitute a mark portion 990 of the alignment mark.

The alumina holes 910A and magnetic bodies 51 are regularly arranged at certain pitches Dp2 (e.g., Dp2=Dp1). For example, each pitch Dp2 is an interval between the centers of adjacent two memory holes in the Y direction when the chip 400 is viewed from the Z direction.

For example, at a position from the Z direction, dimension Db of the alumina hole 910A in a direction parallel to the X-Y plane is the same as dimension Da of the alumina hole 910 in a direction parallel to the X-Y plane.

The alumina holes 910A have substantially the same dimension Db.

FIG. 6 shows, in the alignment mark area A2, pitch Dp2 of the alumina hole (magnetic body) in the Y direction. With respect to the alumina holes 910A in the alignment mark area A2, however, the pitch of two alumina holes 910A arranged in the X direction and the pitch of two alumina holes 910A arranged obliquely to the X-Y plane are each set to a predetermined distance.

Note that in the alignment mark area A2, the pitch Dp2 between the alumina holes 910A (embedded members 51 and 62) may be different from the pitch Dp1 between the alumina holes 910. The dimensions Db of the alumina holes 910A (embedded members 51 and 62) may be different from the dimensions Da of the alumina holes 910.

The alignment mark AM is formed of one or more mark members (e.g., seven mark members constituting a hexagonal lattice) 990.

Note that in the alignment mark area A2, a plurality of alumina holes 910B other than the alumina holes 910A for forming the alignment mark AM may be arranged randomly at no predetermined pitches. The alumina holes 910B need not have uniform dimensions.

Accordingly, members 51B and 62B in each of the alumina holes 910B are arranged randomly in the area A2. The members 51B and 62B do not have uniform dimensions.

For example, an area A3 (also referred to as an intermediate area hereinafter) is provided between the memory cell array area A1 and the alignment mark area A2. The intermediate area A3 surrounds the memory cell array area A1 between the memory cell array area A1 and the alignment mark area A2.

The intermediate area A3 includes a plurality of alumina holes 910X. Each of the alumina holes 910X includes a magnetic body 51 and an insulating layer 62.

The configuration of the intermediate area A3 differs from that of the memory cell array area A1 and that of the alignment mark area A2.

In the intermediate area A3, the alumina holes 910X are arranged randomly in no hexagonal lattice. In the intermediate area A3, the alumina holes 910X are arranged irregularly. The intervals (pitches) between the aluminum holes 910X are different from one another.

For example, the internal members (magnetic bodies 51 and insulating layers 62) of the alumina holes 910X do not function as components of the memory device 1. Hereinafter, the internal members 51 and 62 of the alumina holes 910X will also be referred to as dummy members.

In the intermediate area A3, the alumina holes 910X may have different dimensions in a direction parallel to the X-Y plane. The alumina holes 910X may have different dimensions (depths) in the Z direction.

Hereinafter, the areas A1 and A2 in which the holes are arranged at predetermined pitches will also be referred to as regular alignment areas. The area A3 in which the holes are irregularly aligned will also be referred to as an irregular alignment area (or a free alignment area).

In the domain wall memory of the first embodiment, members (mark portions) for forming an alignment mark are regularly aligned at predetermined pitches in the alignment mark area A2. The mark portions are provided in the holes of an alumina layer formed by anodic oxidation.

Note that the operation of the domain wall memory of the first embodiment is performed by the known technique.

For example, in a read sequence of the domain wall memory, data to be read from a memory cell is shifted to a read cell by a shift operation. The data shifted to the read cell is read by the reading element (MTJ element) 10.

For example, in a write sequence of the domain wall memory, a write current that flows in a direction corresponding to write data is supplied to a write interconnect. The data is written to a write cell by a magnetic field generated from the write interconnect. The data written to the write cell is shifted to a memory cell to which the data is written, by a shift operation.

(1b) Manufacturing Method

A method for manufacturing a domain wall memory of the first embodiment will be described with reference to FIGS. 7 through 15.

Figure 7:
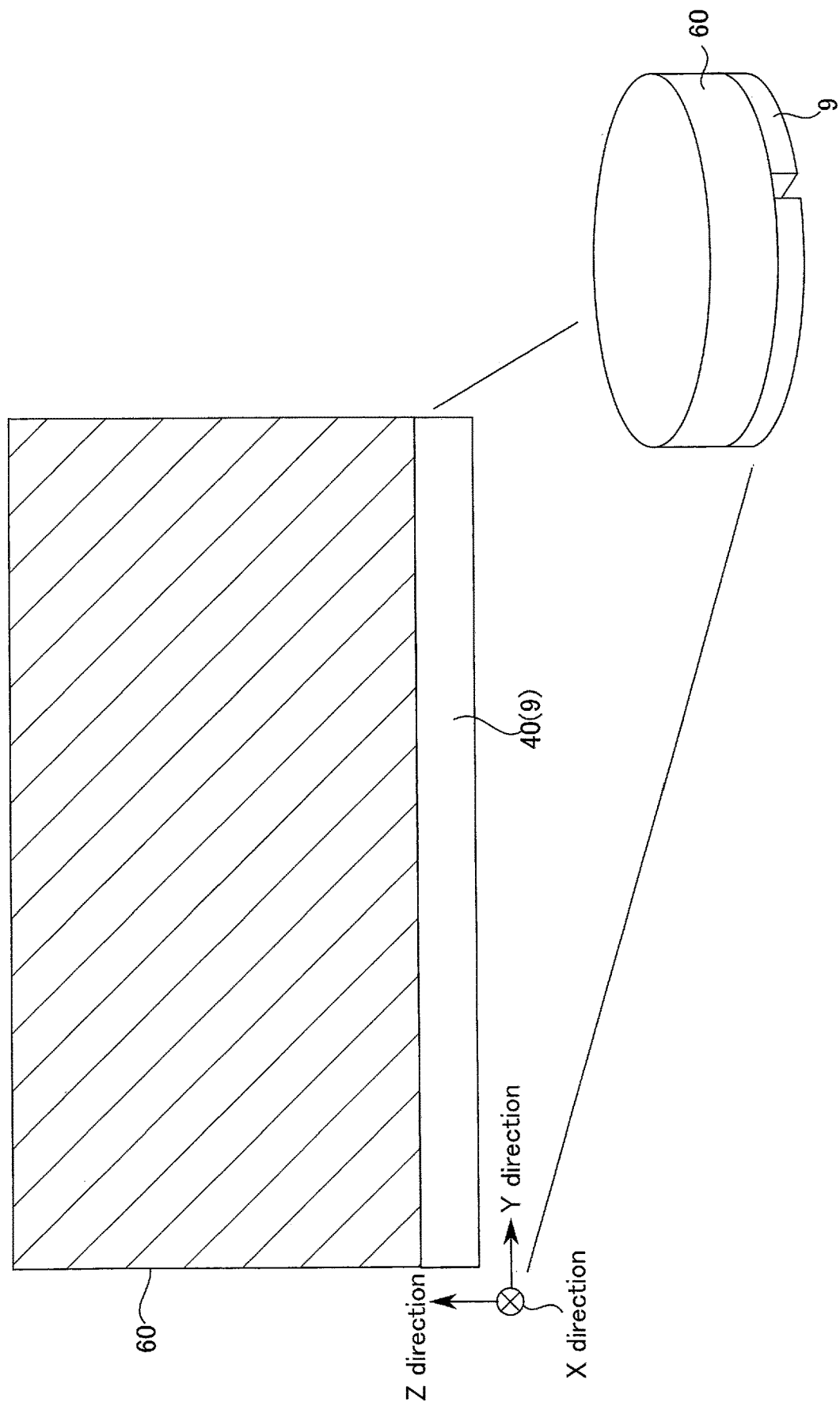
FIGS. 7 and 8 are sectional views each showing one step of a method for manufacturing the memory device of the first embodiment.

FIG. 7 is an illustration of one step of a method for manufacturing a magnetic memory of the first embodiment.

As shown in FIG. 7, an aluminum layer 60 is formed on a first silicon substrate 40 (silicon wafer 9). The thickness of the aluminum layer 60 is approximately several micrometers to several hundreds of micrometers, for example. It is preferable to use high-purity aluminum whose purity is 99.9% or higher for the aluminum layer 60.

The aluminum layer 60 is formed using sputtering, plating, chemical vapor deposition (CVD), bonding of an aluminum layer (aluminum substrate, aluminum foil) to the silicon substrate 40, and the like.

In the example of FIG. 7, the aluminum layer 60 is in direct contact with the silicon substrate 40. However, a film of another material (e.g., an insulating layer) may be formed between the aluminum layer 60 and the silicon substrate 40. In this case, the aluminum layer 60 is formed on the insulating layer covering the silicon substrate 40.

Figure 8:
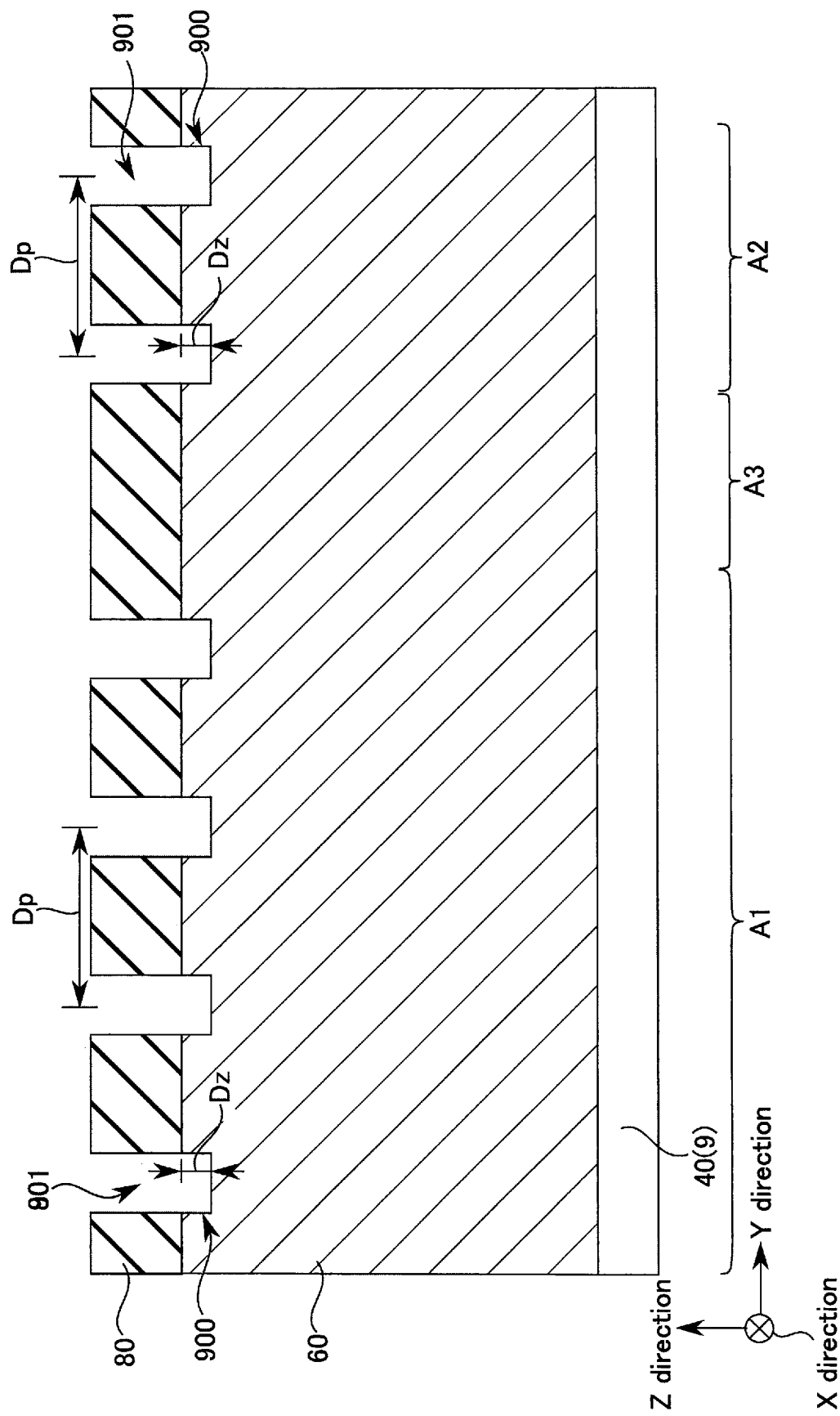
Figure 9:
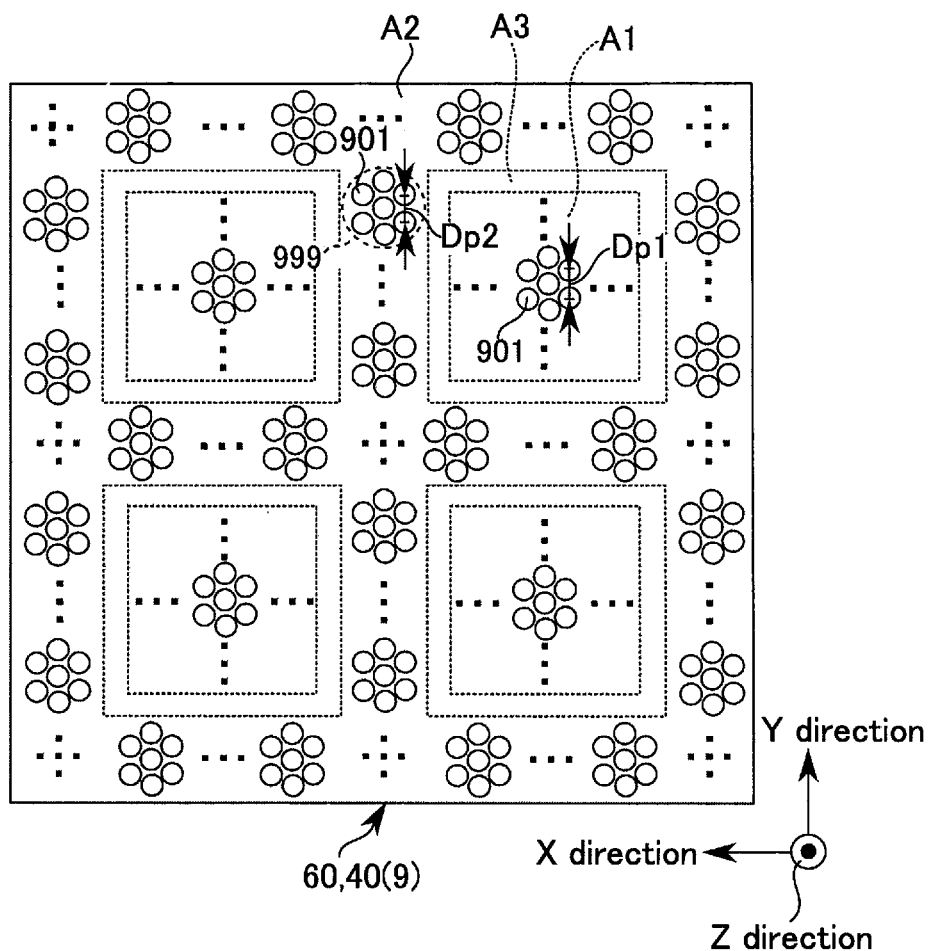
FIG. 9 is a top view showing one step of the method for manufacturing the memory device of the first embodiment.

FIGS. 8 and 9 are illustrations of one step of the method for manufacturing the magnetic memory of the first embodiment. FIG. 8 is a schematic sectional view illustrating one step of the method for manufacturing the magnetic memory of the first embodiment. FIG. 9 is a schematic top view (plan view) corresponding to the step shown in FIG. 8.

As illustrated in FIG. 8, a resist mask 90 is formed on the surface (upper surface) of the aluminum layer 60 in the Z direction by lithography (e.g., photolithography). The resist mask 90 has a plurality of patterns (openings) 901 for forming a reaction starting point of anodic oxidation to the aluminum layer 60.

As shown in FIG. 9, it is preferable that the patterns 901 of the resist mask 90 be laid out in a hexagonal lattice (hexagonal close-packed lattice). Each pattern 901 includes a hole pattern. The hole pattern 901 has a circular (elliptical) planar shape when viewed from the Z direction.

The pitch DP (Dp1, Dp2) between hole patterns 901 is about several tens of nanometers to several hundreds of nanometers. The pitch DP is a distance between the centers of two patterns 800 in the Y direction.

For example, the hole patterns 901 are formed in the memory cell array area A1 and the alignment mark area (dicing area of the wafer 9) A2. For example, no hole patterns are formed in the area A3 between the memory cell array area A1 and the alignment mark area A2. In addition, no hole patterns may be formed in an area other than the area of the alignment mark area A2 where the alignment marks are arranged.

It is preferable to planarize the upper surface of the aluminum layer 60 through a planarization process such as CMP before lithography.

The upper surface of the aluminum layer 60 is etched by dry etching or wet etching using a resist mask 90 having hole patterns 901 as a mask.

Thus, a recess 900 is formed in the upper surface of the aluminum layer 60. The depth (the dimension in a direction perpendicular to the surface of the substrate 40) Dz of the recess 900 is, for example, about several nanometers to several tens of nanometers.

The recess 900 formed by etching serves as a reaction starting point for anodic oxidation of the aluminum layer 60.

As described above, in the first embodiment, the reaction starting point 900 for anodic oxidation of the aluminum layer 60 is formed in the memory cell array area A1 and the alignment mark area (dicing area) A2.

Figure 10:
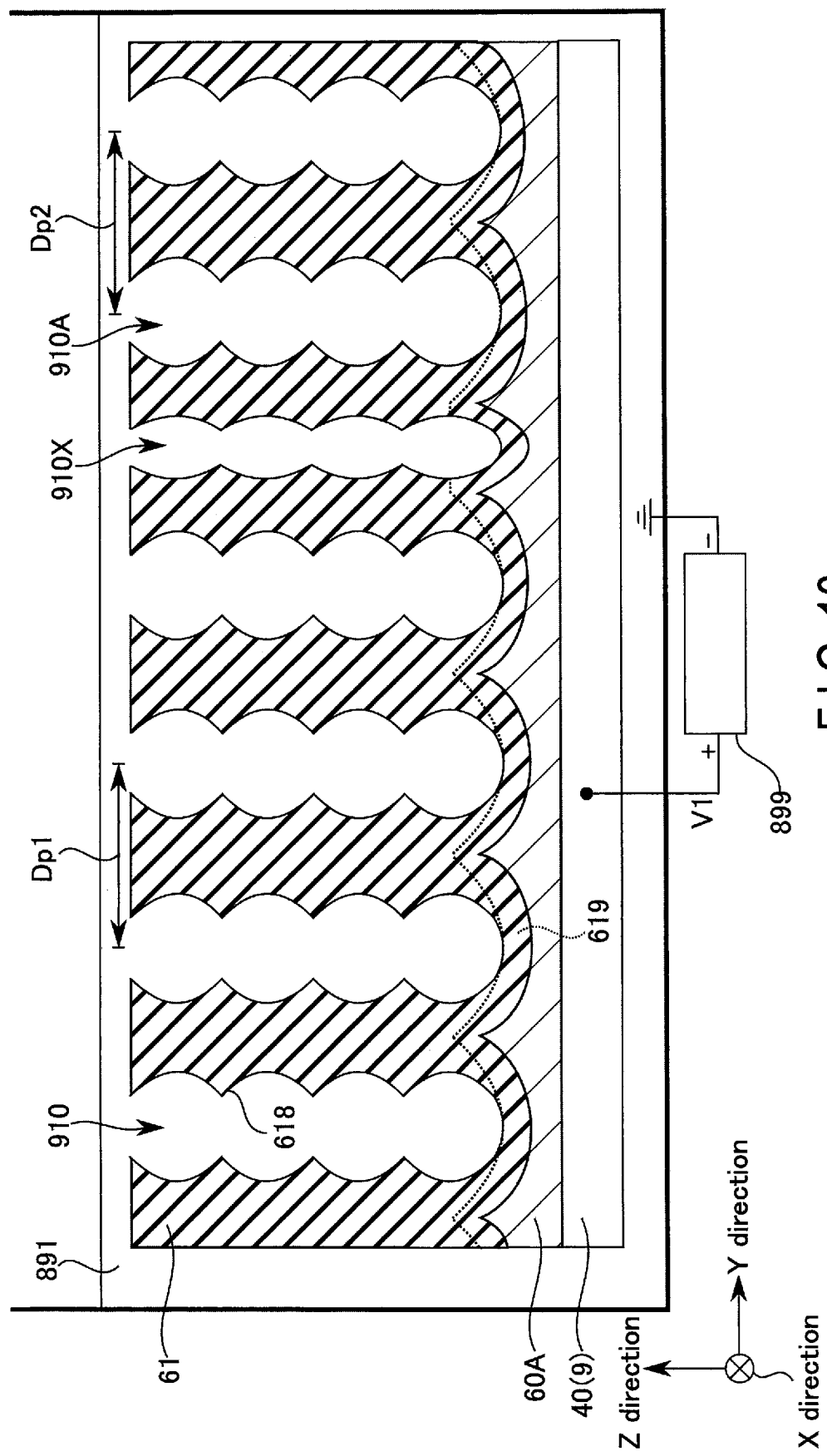
FIGS. 10, 11, 12, 13, 14, 15, and 16 are sectional views each showing one step of the method for manufacturing the memory device of the first embodiment.

FIG. 10 is a schematic sectional view illustrating one step of the method for manufacturing the magnetic memory of the first embodiment.

As shown in FIG. 10, anodic oxidation is performed for the aluminum layer.

The aluminum layer and the silicon substrate 40 are immersed in an electrolyte solution (sulfuric acid, oxalic acid, phosphoric acid, etc.) 891 in an anodic oxidation device.

In the electrolyte solution 891, the silicon substrate is set as an anode. A voltage (hereinafter referred to as anodic oxidation voltage) V1 for anodic oxidation is applied to the silicon substrate 40 from a voltage circuit 899.

Thus, an alumina layer (aluminum oxide layer) 61 is formed above the silicon substrate 40 by oxidation of the aluminum layer.

If the anodic oxidation voltage V1 is optimized, holes (alumina holes) 910 and 910A are formed in the alumina layer 61 (or the aluminum layer 60) to extend in a direction (Z Direction) perpendicular to the upper surface of the silicon substrate 40 at substantially the same pitches Dp1 and Dp2 as the pits of the reaction starting point (recess) 900 formed in advance.

During the anodic oxidation for the aluminum layer, the anodic oxidation voltage V1 may be modulated periodically (at regular time intervals). In accordance with the magnitude of the anodic oxidation voltage V1, periodic constriction (recess) 519 is generated in the alumina holes 910 and 910A. As a result, the alumina holes 910 and 910A can be formed to have a constriction structure. The alumina holes 910 have a structure in which spherical spaces are connected in the Z direction.

Furthermore, the depth (dimension in the Z direction) of the alumina hole 910 can be adjusted to a desired size by adjusting time for anodic oxidation. Thus, an unreacted aluminum layer 60A may remain under the alumina holes 910 and 910A.

For example, the aluminum layer 60A may be formed on the insulating layer on the silicon substrate 40. Due to the presence of the aluminum layer 60A, even though an insulating layer is present between the silicon substrate and the aluminum layer 60, the anodic oxidation voltage V1 can be applied to the aluminum layer from the outer periphery of the substrate to the central part of the substrate via the unreacted aluminum layer 60A if the aluminum layer is used as an electrode.

When the alumina holes 910 and 910A are formed to extend in the Z direction by anodic oxidation, an alumina barrier layer 619 is formed on the bottom of each of the alumina holes 910 and 910 A.

As described above, the shape of the alumina holes is controlled by forming a reaction starting point in anodic oxidation for the aluminum layer and controlling the anodic oxidation voltage.

Therefore, a plurality of alumina holes 910 and 910A, which are arranged regularly (e.g., at predetermined pitches Dp1 and Dp2), are formed in the memory cell array area A1 and the alignment mark area A2.

For example, the alumina hole 910X is formed simultaneously with the alumina hole 910 in the intermediate area A3. The alumina hole 910X is formed in the alumina layer 61 without any reaction starting point (recess).

Thus, the alumina holes 910X in the intermediate area A3 are formed randomly in the area A3, unlike the alumina holes 910 in the areas A1 and A2. Furthermore, the alumina holes 910X in the intermediate area A3 may vary in depth.

Figure 11:
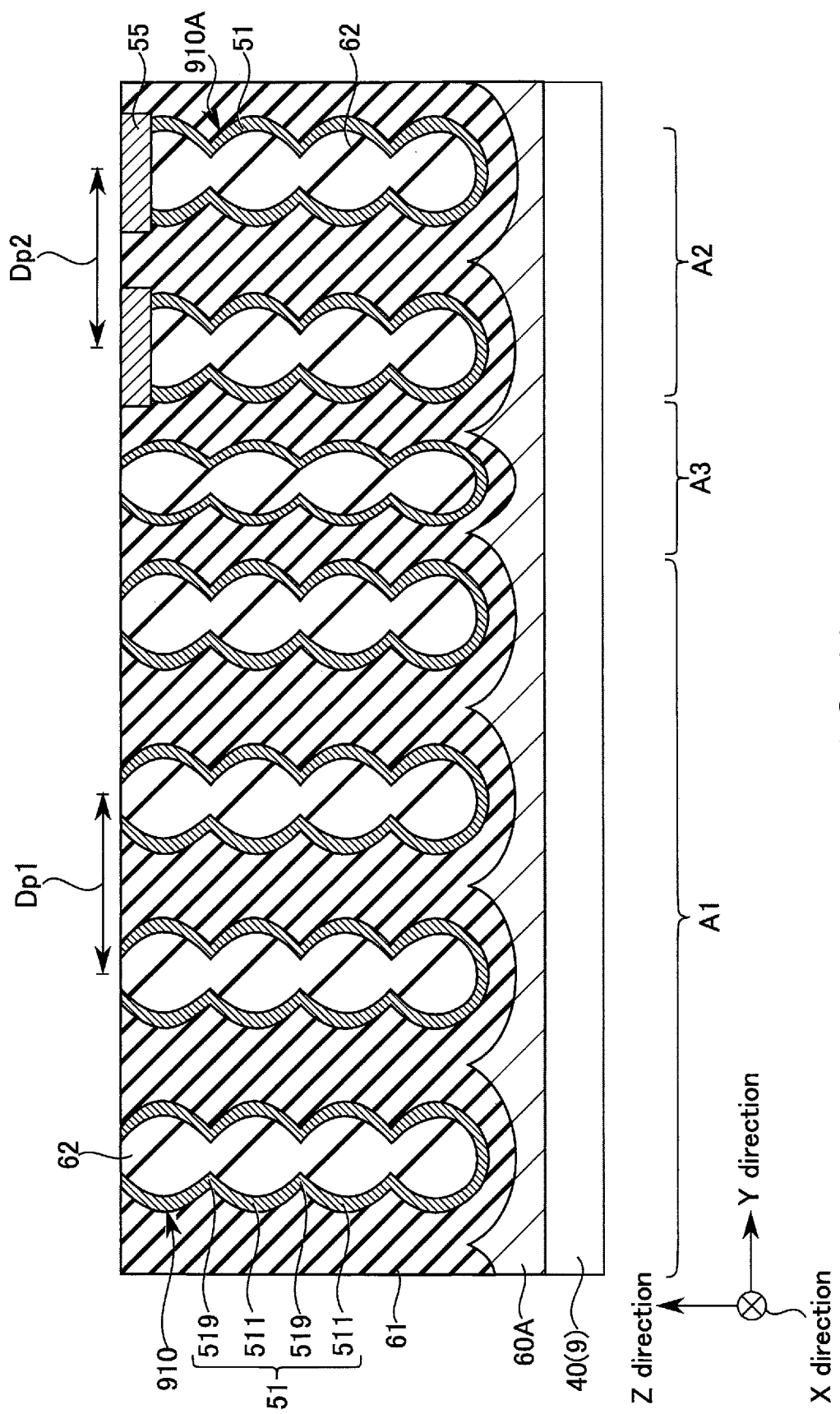

FIG. 11 is a schematic sectional view illustrating one step of the method for manufacturing the magnetic memory of the first embodiment.

As illustrated in FIG. 11, in the memory cell array area A1 and the alignment mark area A2, magnetic bodies (magnetic layers) 51 are formed in the alumina holes 910 and 910A by CVD or Atomic layer deposition (ALD). For example, the formed magnetic body 51 has a cylindrical structure in the alumina holes 910 and 910A.

The structure of the formed magnetic bodies 51 depends upon the shape of the alumina holes 910 and 910A.

When the alumina holes 910 and 910 A have a periodic constriction as described above, the magnetic body 51 is periodically constricted. The magnetic bodies 51 have constricted portions (recesses) 519 at certain intervals in the Z direction. Protrusions 511 that protrude toward the outer surfaces of the magnetic bodies 51 are each provided between the recesses 519 arranged in the Z direction. As described above, in the constricted magnetic bodies 51, the protrusions 511 and the recesses 519 are formed in the alumina holes 910 and 910A such that they are arranged alternately in the Z direction.

Insulating layers (e.g., a silicon oxide layers) 62 are each buried in a gap of the corresponding cylindrical magnetic layer 51 by CVD, ALD or coating.

In the intermediate area A3, the magnetic bodies and insulating layers are formed in the alumina holes (not shown) by a step common to that of forming the magnetic bodies. 51 and the insulating layers 62 in the areas A1 and A2. In the intermediate area A3, a plurality of magnetic bodies (and insulating layers) are arranged at irregular pitches. The magnetic bodies 51 in the intermediate area A3 are formed nonuniformly in its shapes.

For example, in the alignment mark area A2, an upper portion of the magnetic body 51 in the alumina hole 910 is removed by etching. Accordingly, a recess is formed in the upper surface of the alumina layer 61 in the area A2. A conductive layer (e.g., a metal layer) 55 is formed in the recess above the magnetic material 51.

Figure 12:
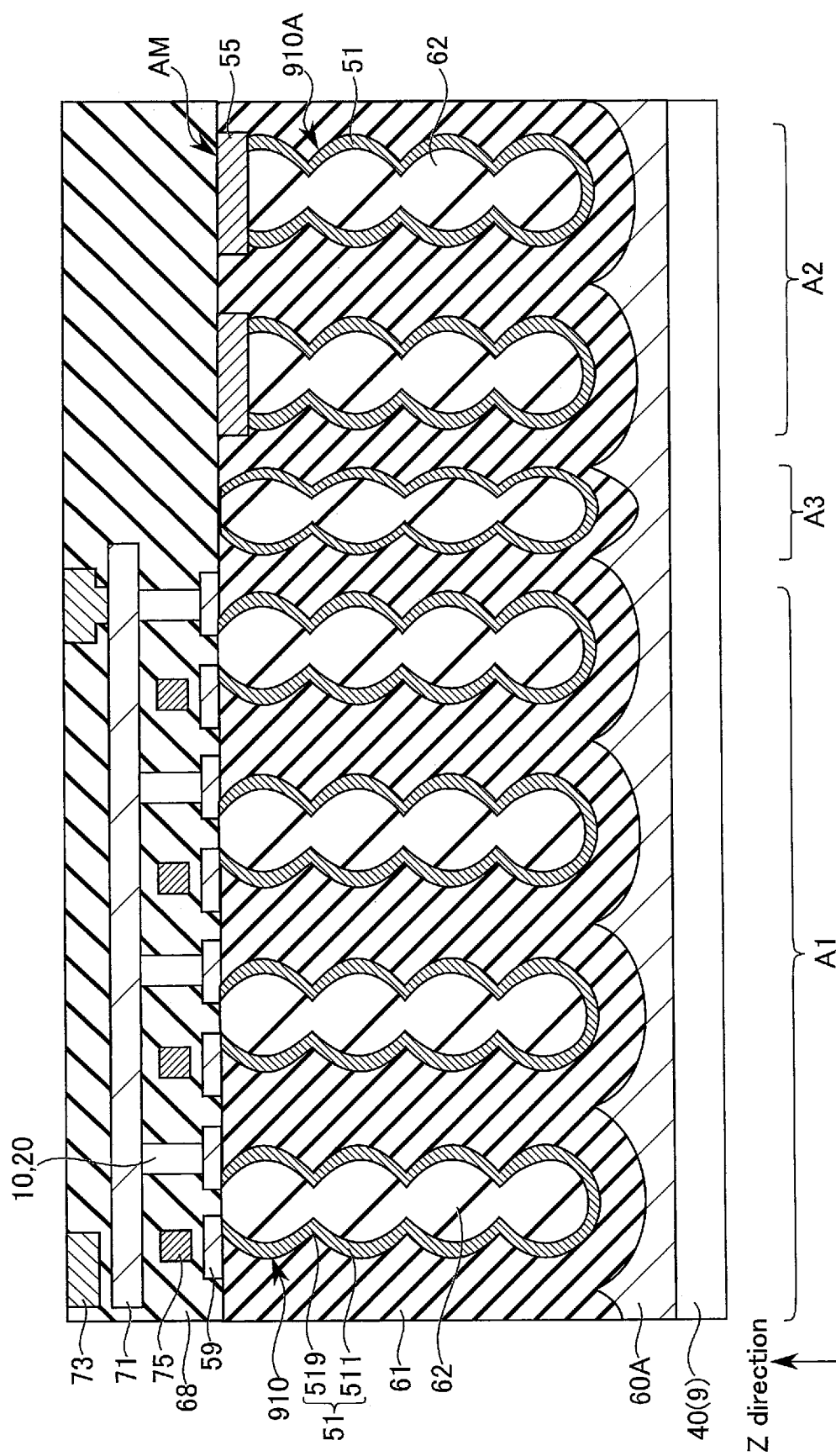

FIG. 12 is a schematic sectional view illustrating one step of the method for manufacturing the magnetic memory of the first embodiment.

As illustrated in FIG. 12, components 10, 20 and 59, interconnects 71 and 75, interlayer insulating film 68 and the like of the memory cell unit are formed above a first surface of the alumina layer 61 by the known technique.

For example, a plurality of magnetic layers 59 are formed on the upper surface of the alumina layer 61 by the known technique. Each of the magnetic layers 59 is connected to its corresponding magnetic body 51. A write interconnect 75 is formed above each of the magnetic layers 59.

A reading element (e.g., an MTJ element) 10 is formed on the upper surface of each of the magnetic layers 59 in the Z direction. A switching element 20 is formed on the reading element 10 in the Z direction.

A bit line 71 is formed above the alumina layer 61 so as to be connected to the switching element 20. A plurality of pads (e.g., bonding pads) 73 are formed above the bit line 71.

Lithography (e.g., photolithography) is performed for patterning each of the components 10, 20, 59, 71 and 75. In the first embodiment, a mask for the lithography is aligned with the substrate 40 (wafer 9) using the alignment mark AM (mark portion 990 in the hole 910A) formed during anodic oxidation.

Figure 13:
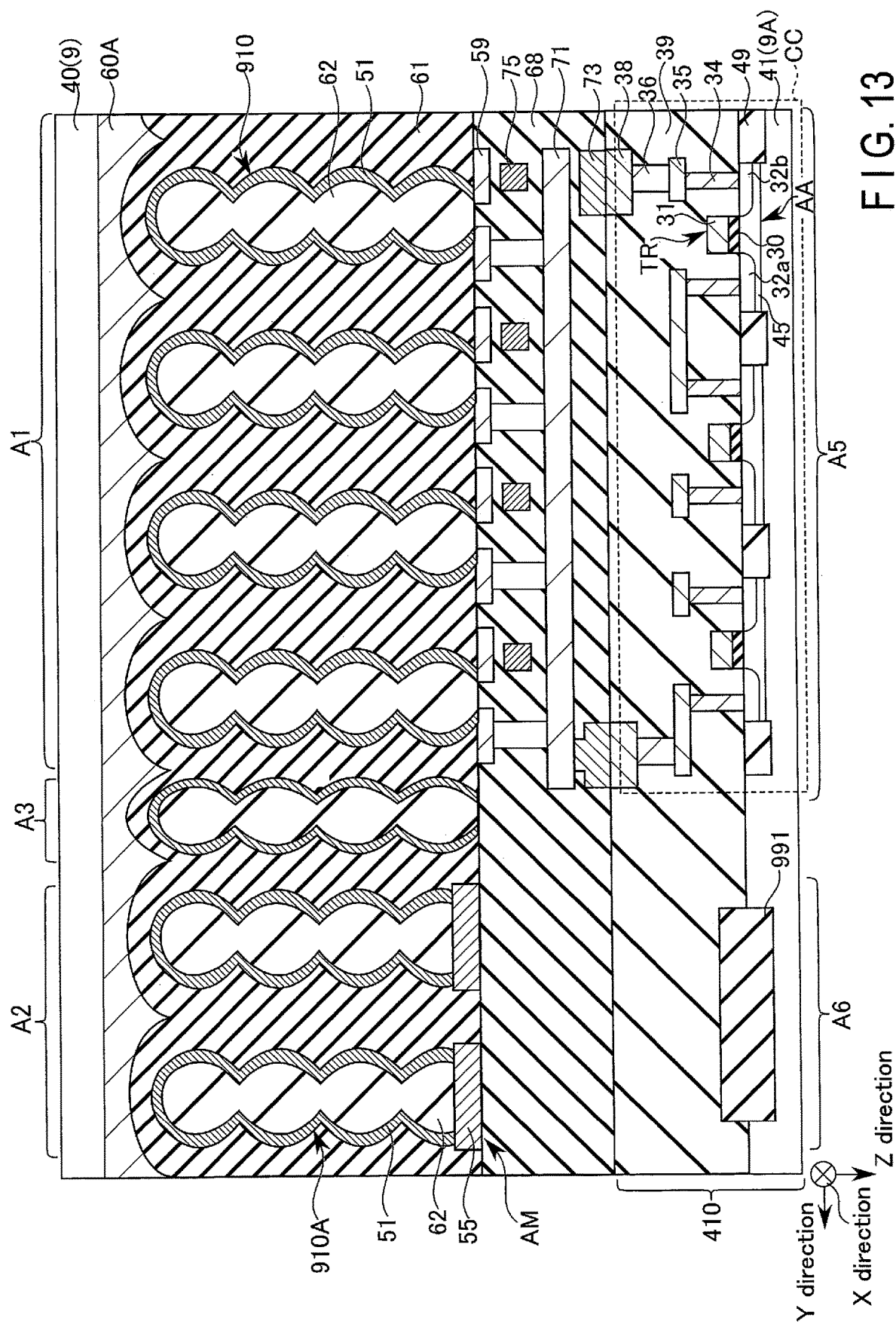

FIG. 13 is a schematic sectional view illustrating one step of the method for manufacturing the magnetic memory of the first embodiment.

As illustrated in FIG. 13, a memory control circuit (CMOS circuit) CC is formed in a circuit area A5 of a second silicon substrate 41 (wafer 9A) by the known technique. For example, the gate insulating layer 30 and gate electrode 31 of the transistor TR are formed on the active area AA (well region 45) of the silicon substrate 41. The source/drain regions 32 (32a, 32b) of the transistor TR are formed in the well region 45.

The plug 36 and interconnect are formed in the interlayer insulating film 39 covering the transistor TR. The pad 38 is formed above the upper surface of the second silicon substrate 41.

For example, the alignment mark 991 is formed in the alignment mark area (dicing area) A6 of the silicon substrate 41 (wafer).

Note that the process of forming the memory control circuit CC may be executed in parallel with the process of forming the memory cell array 100, or may be executed before or after the process of forming the memory cell array 100.

The two silicon substrates (silicon wafers) 40 and 41 are bonded together. The upper surfaces (hereinafter referred to as bonded surfaces) of the silicon substrates and 41 are bonded to each other.

The silicon substrate 40 is bonded to the silicon substrate 41 such that the pad (e.g., bonding pad) 73 of the silicon substrate 40 is opposed to the pad (e.g., bonding pad) 38 of the silicon substrate 41.

For example, the bonding pad 73 is bonded to the bonding pad 38 such that the silicon substrate 41 is located below the silicon substrate 40 in the Z direction. The two silicon substrates 40 and 41 are bonded together by covalent bonding generated between the pads 73 and 38 (and covalent bonding generated between the interlayer insulating layers 68 and 39).

For example, in the first embodiment, when the silicon substrates 40 and 41 are bonded, they are aligned with each other using the alignment mark AM in the alumina layer 61 and the alignment mark 991 in the silicon substrate 41.

Figure 14:
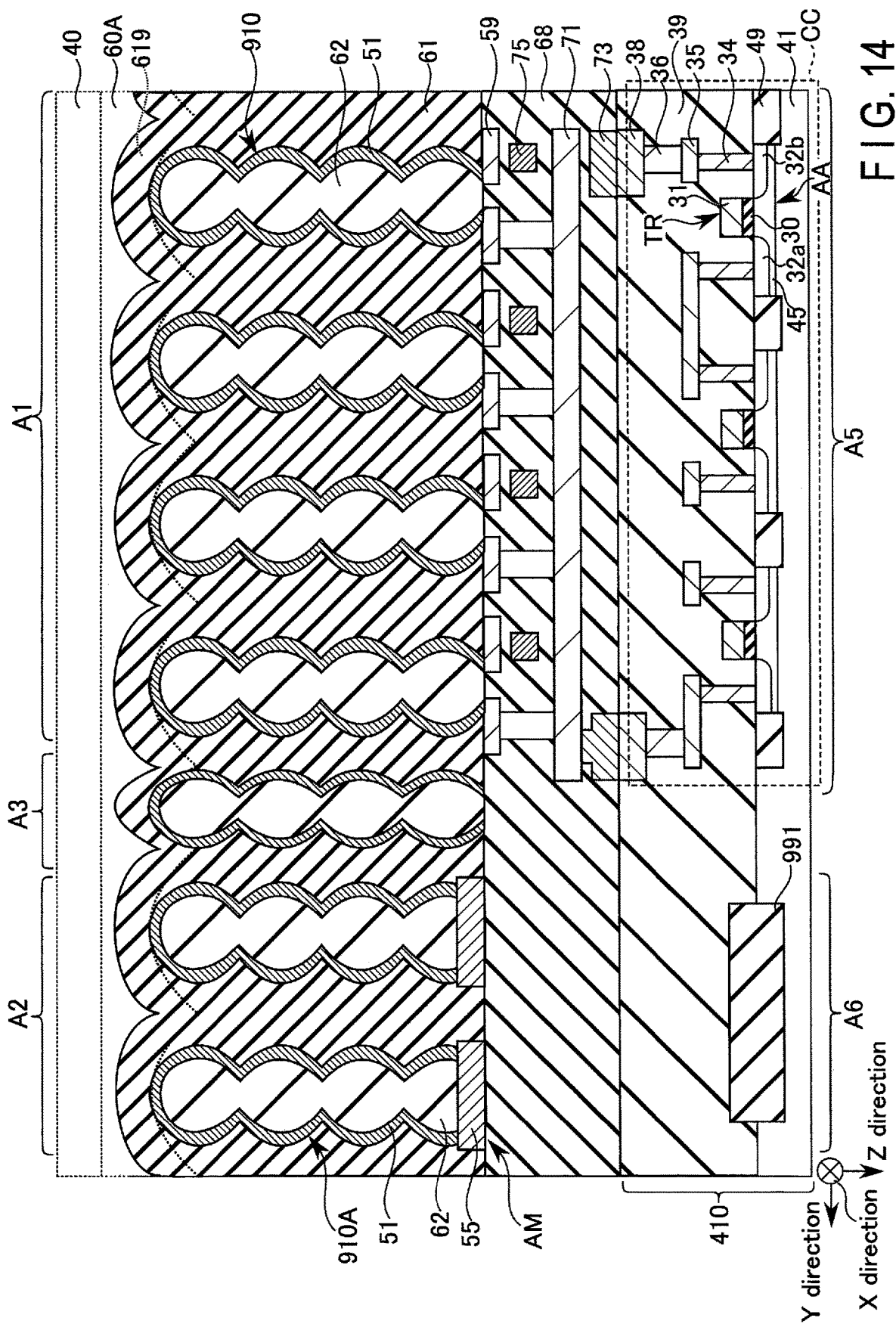

FIG. 14 is a schematic sectional view illustrating one step of the method for manufacturing the magnetic memory of the first embodiment.

As illustrated in FIG. 14, silicon on the upper side of the bonded two silicon substrates 40 and 41 (Here, the back surface of the first silicon substrate 40) is removed by polishing such as back grinding. Thus, the unreacted aluminum layer 60A is exposed. The silicon substrate (wafer) 41 supports the thinned substrate 40.

The unreacted aluminum layer 60A is removed by etching (e.g., wet etching). Thus, the alumina barrier layer 619 (the bottom of the alumina hole 910) above the magnetic body 51 in the Z direction is exposed.

Figure 15:
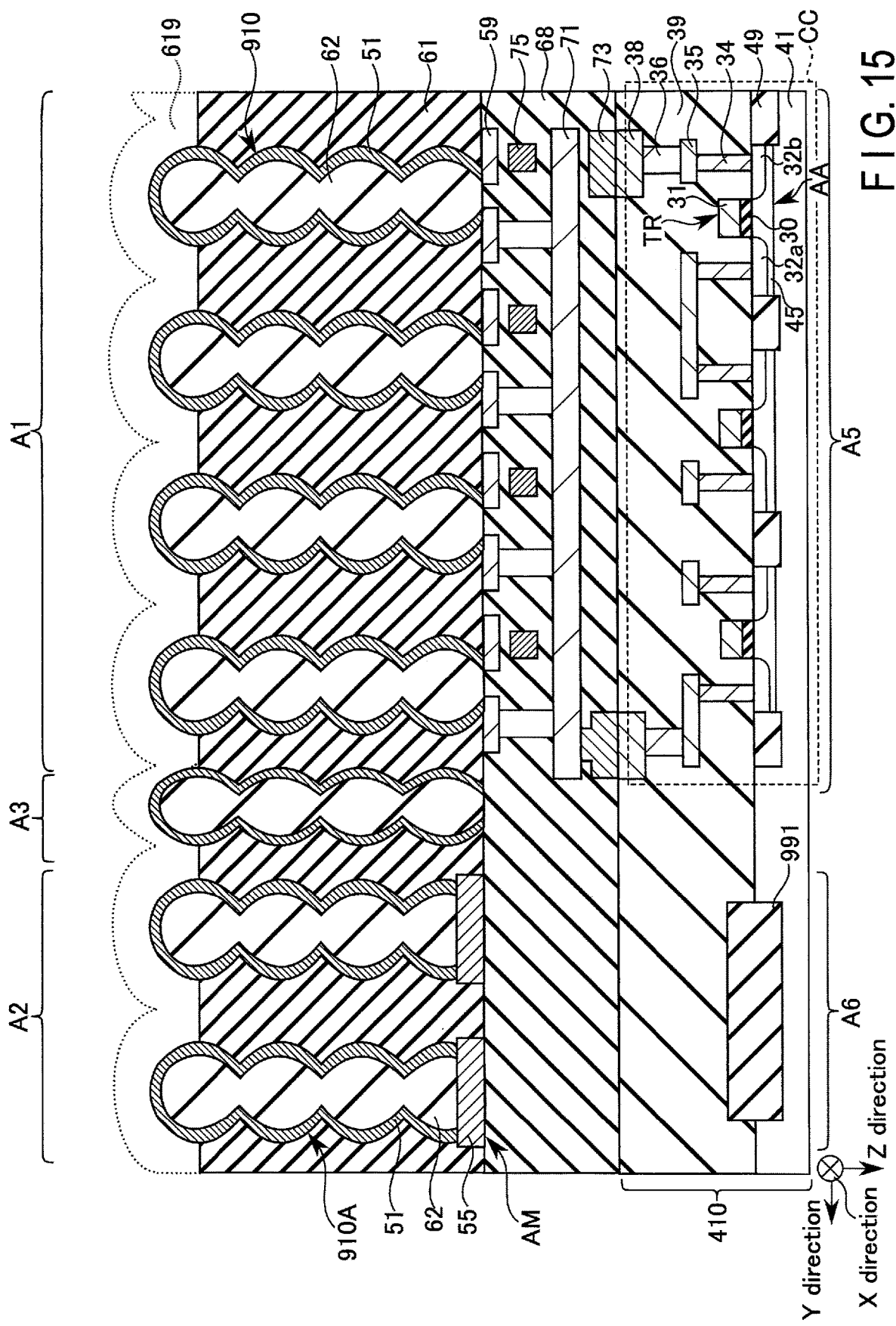

FIG. 15 is a schematic sectional view illustrating one step of the method for manufacturing the magnetic memory of the first embodiment.

As illustrated in FIG. 15, the exposed alumina barrier layer 619 is etched by wet etching using phosphoric acid, for example. Thus, the magnetic bodies 51 are exposed from the alumina holes 910 and 910A.

Figure 16:
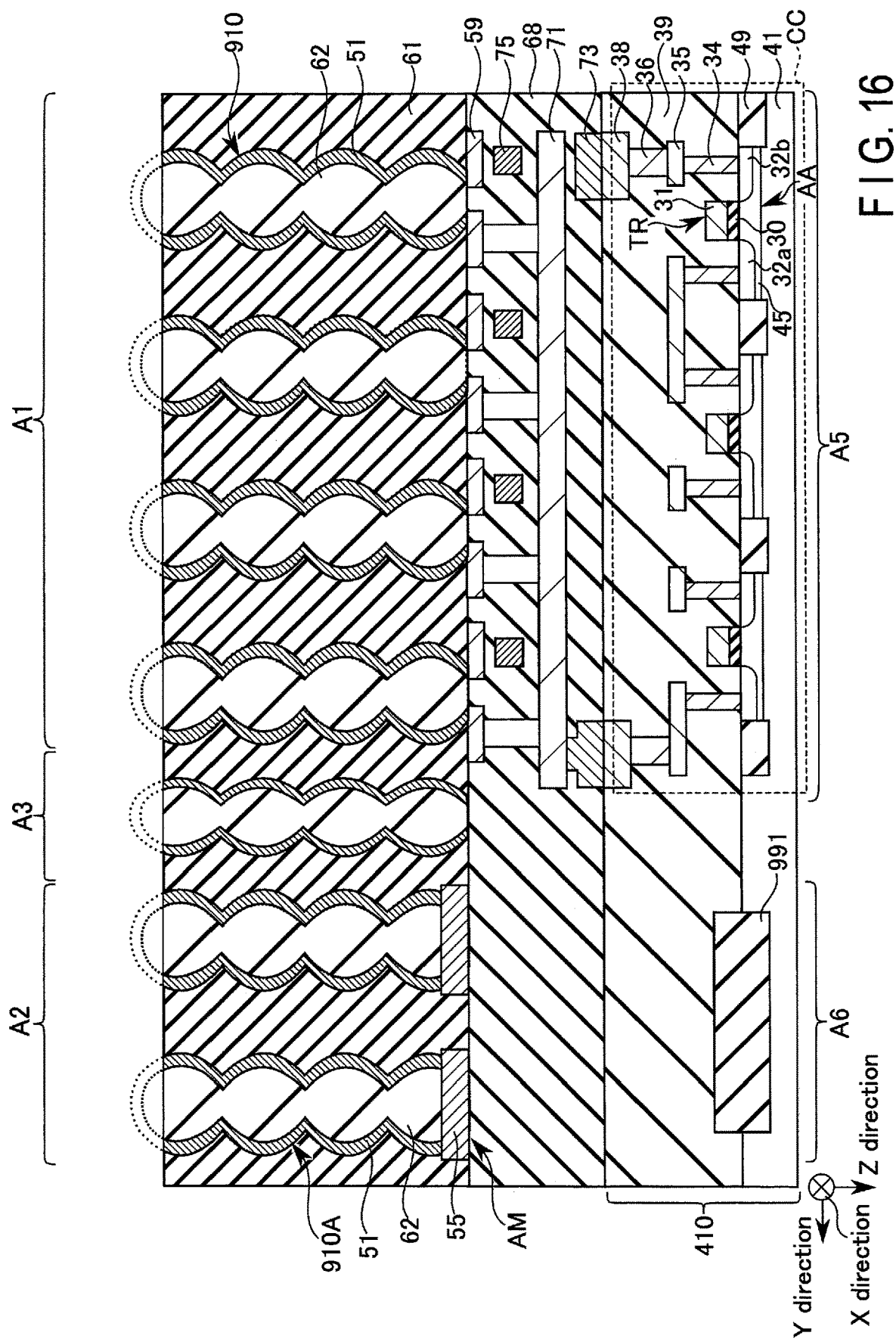

FIG. 16 is a schematic sectional view illustrating one step of the method for manufacturing the magnetic memory of the first embodiment.

As illustrated in FIG. 16, the magnetic bodies 51 and insulating layers 62 are planarized by CMP. At this time, the magnetic bodies 51 and insulating layers 62 are polished using the alumina layer 61 as a stopper layer.

After that, the components of the magnetic memory such as electrodes, elements, interconnects and pads are formed by the known technique so as to be connected to the magnetic bodies 51, as shown in FIG. 5. For example, the interconnects (e.g., word lines WL) are formed to extend in the X direction on the second surface of the alumina layer 61 so as to be connected to the magnetic bodies 51. The interlayer insulating layer 79 is formed on the alumina layer 61 to cover the interconnects 70. A plurality of pads (external connection terminals) 78 are formed in the interlayer insulating layer 79. The pads 78 are connected to the interconnects 70, 71 and 75 and the like in the interlayer insulating layers 68 and 79.

In forming the interconnects 70 and pads 78, the alignment mark AM of the memory cell array chip 400 may be used to align the mask for lithography with the wafer.

Thus, the domain wall memory 1 of the first embodiment is formed with the memory control circuit chip (wafer) 41 as a support substrate.

After that, the domain wall memory 1 of the first embodiment is chipped by dicing the wafer. At this time, some or all of the alignment marks of the alignment mark area A2 in the dicing area may be cut out, and the alignment marks may be removed from the chips of the domain wall memory.

The magnetic memory of the first embodiment is thus completed as described above.

(c) Summary

In the first embodiment, the magnetic memory has a structure in which two chips are bonded together.

In a plurality of steps to be performed after a backgrinding step for silicon substrates (wafers) to forming memory cell array chips, a substrate for forming memory control circuit chips serves as a support substrate for the memory cell array chips formed by wafer backgrinding.

In the first embodiment, therefore, even when a wafer having a large diameter is used as a substrate, no substrate handing problem occurs.

In the magnetic memory of the first embodiment, the magnetic bodies 51 serving as memory units are provided in the holes 910 formed in the insulating layer 61. The holes 910 are formed by anodic oxidation for the aluminum layer.

In the magnetic memory of the first embodiment, the alignment mark AM is used in different steps of forming the magnetic memory.

A general alignment mark is formed by transferring a resist pattern, which is formed simultaneously with a lithography step for the surface of a substrate (wafer), to the substrate by dry etching.

When anodic oxidation is performed for the aluminum layer 60 on the wafer to form the holes, even if an alignment mark is formed on the surface of the aluminum layer 60 using a material before anodic oxidation, the shape of the alignment mark is deformed due to the volume expansion of aluminum close to the alignment mark when the aluminum is changed to alumina during anodic oxidation. The use of the alignment mark after the anodic oxidation step is not therefore preferable.

In a step of forming a reaction starting point (recess) of anodic oxidation in the aluminum layer (e.g., a resist mask photolithography step), it is desirable to form an alignment mark for a lithography step.

In the first embodiment, a member for forming the alignment mark AM is provided in the hole 910A of the layer 61 formed by anodic oxidation.

In the first embodiment, as shown in FIGS. 6 and 8 to 12, the area A2 in which the alignment mark AM is formed and the area A3 in which no alignment mark is formed are provided separately in the memory cell array chip. The pattern 990 of the alignment mark AM is formed using, for example, the same hole pattern as a hole pattern for forming a memory unit (e.g., a magnetic body).

In the first embodiment, the alignment mark AM includes mark portions 990 in a plurality of holes 910A in a hexagonal lattice in the alignment mark area A2.

In the alignment mark area A2, like the alumina holes (hole patterns) 910 for forming a memory unit, the alumina holes 910A whose alignment is controlled are formed for an arrangement of the alignment mark AM by anodic oxidation.

No alumina holes having a predetermined alignment are formed in the area A3 where no alignment marks (and memory cell unit) are arranged. For example, in the area A3, a plurality of alumina holes 910X are formed in the alumina layer 61 in an unaligned state (natural alignment state).

In this case, according to the first embodiment, since anodic oxidation of aluminum occurs in the areas A2 and A3 (and A1), the alignment mark can be prevented from being deformed due to its volume expansion.

In the first embodiment, the detection of the alignment mark so formed makes it possible to form, by the lithography, components such as switching elements and reading elements (write or read elements) in positions that overlap the alumina holes in the memory cell array area in the Z direction.

According to the first embodiment, when an electrode connected to the magnetic layer is formed by lithography on the surface opposed to the bonding surface of a chip, the aluminum layer used for anodic oxidation does not exist on the opposed surface but changes into an alumina layer through which illumination light for alignment can be transmitted.

In the present embodiment, therefore, the formed alignment mark can be detected from the surface opposed to the bonding surface of a chip. As a result, an electrode can be formed on the opposed surface by lithography for alignment using mark portions in the alumina holes.

As described above, in the first embodiment, the alignment mark does not change in its shape. As a result, the accuracy of alignment in the manufacturing process of the magnetic memory is improved.

It should be noted that not only the alignment mark but also, for example, a mark for measuring an overlay with a lithography layer to be performed after the anodic oxidation step, may be formed by substantially the same process as the formation of the alignment mark.

When a layer to be oxidized by anodic oxidation is increased in its thickness, the rectilinearity of hole formation may be lost in a deep portion of the alumina hole (a portion opposed to the reaction starting point in the Z direction). Therefore, the boundary between the area A2 in which the alignment of the alumina holes is controlled and the area A3 in which it is not controlled may become unclear.

In the first embodiment, a material other than alumina (e.g., a material having relatively high reflectivity, such as metal) may be embedded on the surface (bonding surface, reaction starting point forming surface) of the alumina hole where the boundary between the alignment mark area (regular alignment area) A2 and the area (natural alignment area) A3 is relatively clear.

In the first embodiment, therefore, higher-accuracy alignment can be achieved.

As described above, the memory device and the method for manufacturing of the memory device of the first embodiment can be improved in reliability of process of manufacturing the memory device. In addition, the memory device and the manufacturing method can improve the yield of devices to be manufactured.

(2) Second Embodiment

A memory device of the second embodiment and a method for manufacturing the memory device will be described with reference to FIGS. 17 through 25.

(2a) Exemplary Configuration

Figure 17:
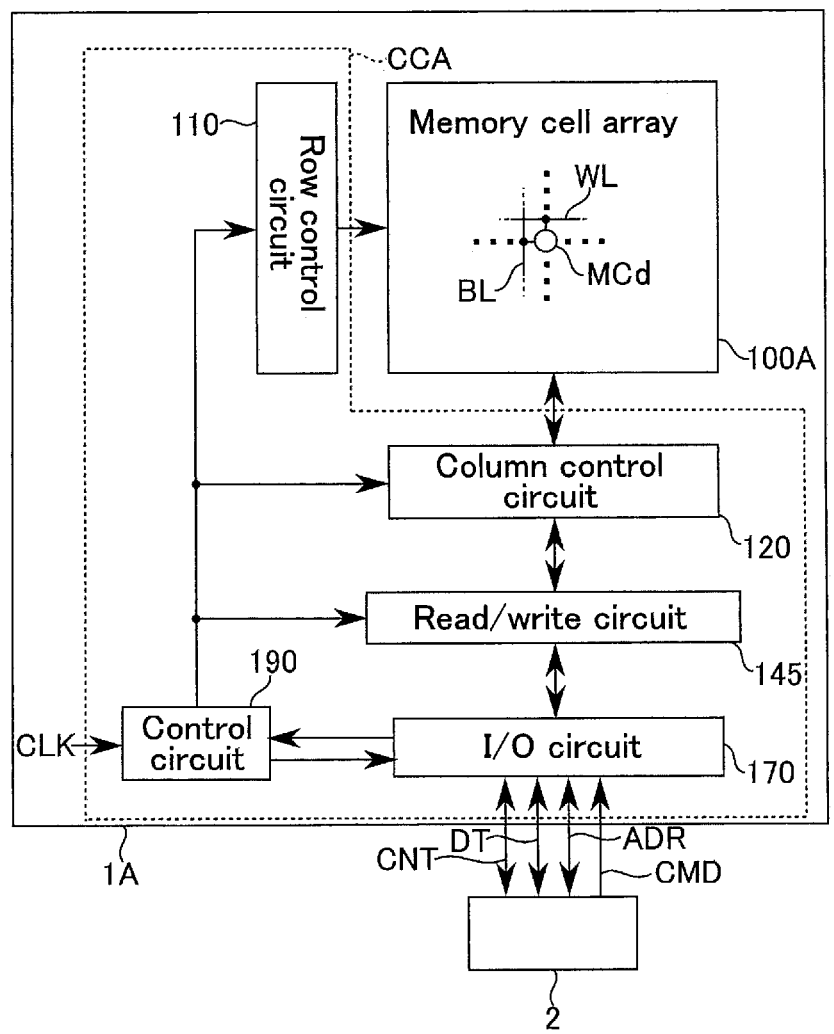
FIG. 17 is a block diagram showing an exemplary configuration of a memory device of a second embodiment.

FIG. 17 is a block diagram showing an exemplary configuration of the memory device of the second embodiment.

The memory device of the second embodiment is a semiconductor memory.

As shown in FIG. 17, the semiconductor memory of the second embodiment includes a memory cell array 100A and a memory control circuit (CMOS circuit) CCA.

In the second embodiment, the semiconductor memory device is a dynamic random access memory (DRAM).

In the DRAM 1A of the second embodiment, the memory cell array 100A differs in configuration from the memory cell array of the domain wall memory of the first embodiment.

The memory cell array 100A includes a plurality of memory cells MCd, a plurality of word lines WL and a plurality of bit lines BL. Each of the memory cells MCd is connected to at least one word line WL and at least one bit line BL. Each of the memory cells MCd can store data of one bit or more.

Each of the memory cells MC of the DRAM 1A includes a field effect transistor (also referred to as a cell transistor hereinafter) and a capacitive element (also referred to as a cell capacitor hereinafter).

The DRAM 1A of the second embodiment includes a row control circuit 110, a column control circuit 120, read/write circuit 145, an I/O circuit 170, a control circuit 190 and the like as a memory control circuit (CMOS circuit) CCA.

Substantially as in the first embodiment, the row control circuit 110 and column control circuit 120 control the rows (e.g., word lines) and columns of the memory cell array 100A in accordance with an address ADR. Thus, a word line WL is selected and nonselected (activated/deactivated), a bit line BL is selected and nonselected (activated/deactivated), a word line WL and a bit line BL are supplied with a voltage, and the like.

The read/write circuit 145 writes data to the memory cell array 100A (write operation) and reads data from the memory cell array 100A (read operation). During data writing, the read/write circuit 145 sends a signal (voltage or current) corresponding to the write data to the memory cell array 100A via the column control circuit 120. During data reading, the read/write circuit 145 receives a signal (voltage or current) corresponding to read data from the memory cell array 100A via the column control circuit 120. Note that a circuit for writing data and a circuit for reading data may be provided in the DRAM 1A independently of each other.

The I/O circuit (input/output circuit) 170 receives a command CMD, an address ADR, data (e.g., write data) DT, a plurality of control signals CNT and the like from an external device (e.g., a processor) 2. The I/O circuit 170 sends the control signals CNT and data (e.g., read data) DT to a device outside the DRAM 1A.

In response to the command CMD and control signals CNT, the control circuit 190 controls other circuits 110, 120, 145 and 170 according to an operation to be performed by the DRAM 1A. When the memory device 1A is a DRAM, the control circuit 190 controls and performs refresh of data in the memory cell array 100A (refresh operation) in addition to writing and reading of data.

For example, the control circuit 190 controls the circuits 110, 120, 145 and 170 with timing synchronized with a clock signal CLK. As a result, data is written and read with timing synchronized with the clock signal CLK. The clock signal CLK is generated in the interior of the DRAM 1A or supplied from the external device 2.

Note that the DRAM 1A may further include a refresh control circuit, a clock generation circuit, an internal voltage generation circuit and the like.

<Memory Cell Array>

FIG. 18 is an equivalent circuit diagram illustrating an exemplary configuration of the memory cell array of the memory device of the second embodiment.

As described above, the memory cell array 100A includes a plurality of memory cells MCd.

The memory cells MCd are arranged in matrix in the X-Y plane of the memory cell array 100A.

One terminal (one end) of each memory cell MCd is connected to its corresponding bit line BL.

The other terminal (the other end) of the memory cell MCd is connected to a plate line (plate electrode) PL.

The control terminal of the memory cell MCd is connected to its corresponding word line WL.

The memory cells MCd arranged in the X direction are connected to a common word line WL. The memory cells MCd arranged in the Y direction are connected to a common bit line BL. The memory cells MCd for each control unit are connected to a common plate line PL.

As described above, each of the memory cells MCd includes a cell capacitor 80 and a cell transistor 81.

The cell capacitor 80 holds a charge amount associated with data of one bit or more. The cell capacitor 80 functions as a memory element of the memory cell MCd.

The cell transistor 81 switches a connection between a memory cell MCd and its corresponding bit line BL. The cell transistor 81 functions as a selection element of the memory cell MCd.

One terminal (one source/drain) of the cell transistor 81 is connected to its corresponding bit line BL as a terminal of the memory cell MCd.

The other terminal (the other source/drain) of the cell transistor 81 is connected to one terminal (one end) of the cell capacitor 80 via a node ND.

The other terminal (the other end) of the cell capacitor 80 is connected to the plate line PL as a terminal of the memory cell MCd.

The gate of the cell transistor 81 is connected to its corresponding word line WL. The gate of the cell transistor 81 serves as a control terminal of the memory cell MCd.

FIG. 19 is a bird's eye view showing an exemplary configuration of a memory cell in the DRAM of the second embodiment.

As shown in FIG. 19, in the second embodiment, the cell transistor 81 overlaps the cell capacitor 80 in the Z direction. The Z direction is perpendicular to the X-Y plane. The Z direction intersects the X and Y directions.

The cell capacitor 80 includes at least two electrodes 801 and 803 and an insulating layer 802. The insulating layer (also referred to as a capacitor insulating layer hereinafter) 802 is provided between the two electrodes (also referred to as capacitor electrodes hereinafter) 801 and 803.

The capacitor electrode 801 is electrically connected to the plate line PL. The capacitor electrode 803 is connected to the source/drain of the cell transistor 81. The capacitor insulating layer 802 and the capacitor electrode 801 are provided between the capacitor electrode 803 and the plate line PL. Thus, the capacitor electrode 803 is not in direct contact with the plate line PL.

The cell transistor 81 includes at least a semiconductor layer 810, a gate insulating layer 811 and a gate electrode 812. The semiconductor layer (also referred to as a channel layer or a body portion hereinafter) 810 has a columnar structure extending in the Z direction. The gate electrode 812 is opposed to the side surface of the columnar semiconductor layer 810 with the gate insulating layer 811 therebetween. The gate insulating layer 811 is provided between the side of the semiconductor layer 810 and the gate electrode 812.

The channel region of the cell transistor 81 is provided in the semiconductor layer 810. The two source/drain regions of the cell transistor 81 are provided in the semiconductor layer 810. Hereinafter, the columnar semiconductor layer 810 will also be referred to as a semiconductor pillar (or channel pillar).

In the second embodiment, the cell transistor 81 is a vertical transistor.

One of the two source/drain regions is provided at one end (on the top) of the semiconductor layer 810 in the Z direction, and the other is provided at the other end (on the bottom) of the semiconductor layer 810 in the Z direction. The two source/drain regions of the vertical transistor 81 are arranged in the Z direction. One of the two source/drain regions is provided above the other in the Z direction.

The source/drain region on the upper side of the cell transistor 81 is connected to the bit line BL. The source/drain region on the lower side of the cell transistor 81 is connected to the capacitor electrode 803.

Thus, the current path of the vertical cell transistor 81 extends along the Z direction. In the cell transistor 81, current flows in the Z direction.

In the second embodiment, the cell transistor 81 has a gate all around (GAA) structure. Regarding the cell transistor 81 with the GAA structure, the gate electrode 812 overlaps the entire side of the channel region in the semiconductor layer 810. The gate electrode 812 annularly covers the side (plane along the Z direction) of the channel region through the gate insulating layer 811. Thus, the cell transistor 81 has high gate electrostatic controllability.

In the second embodiment, the cell capacitor 80 is provided in the alumina hole of the alumina layer 61.

<Exemplary Configuration>

Figure 20:
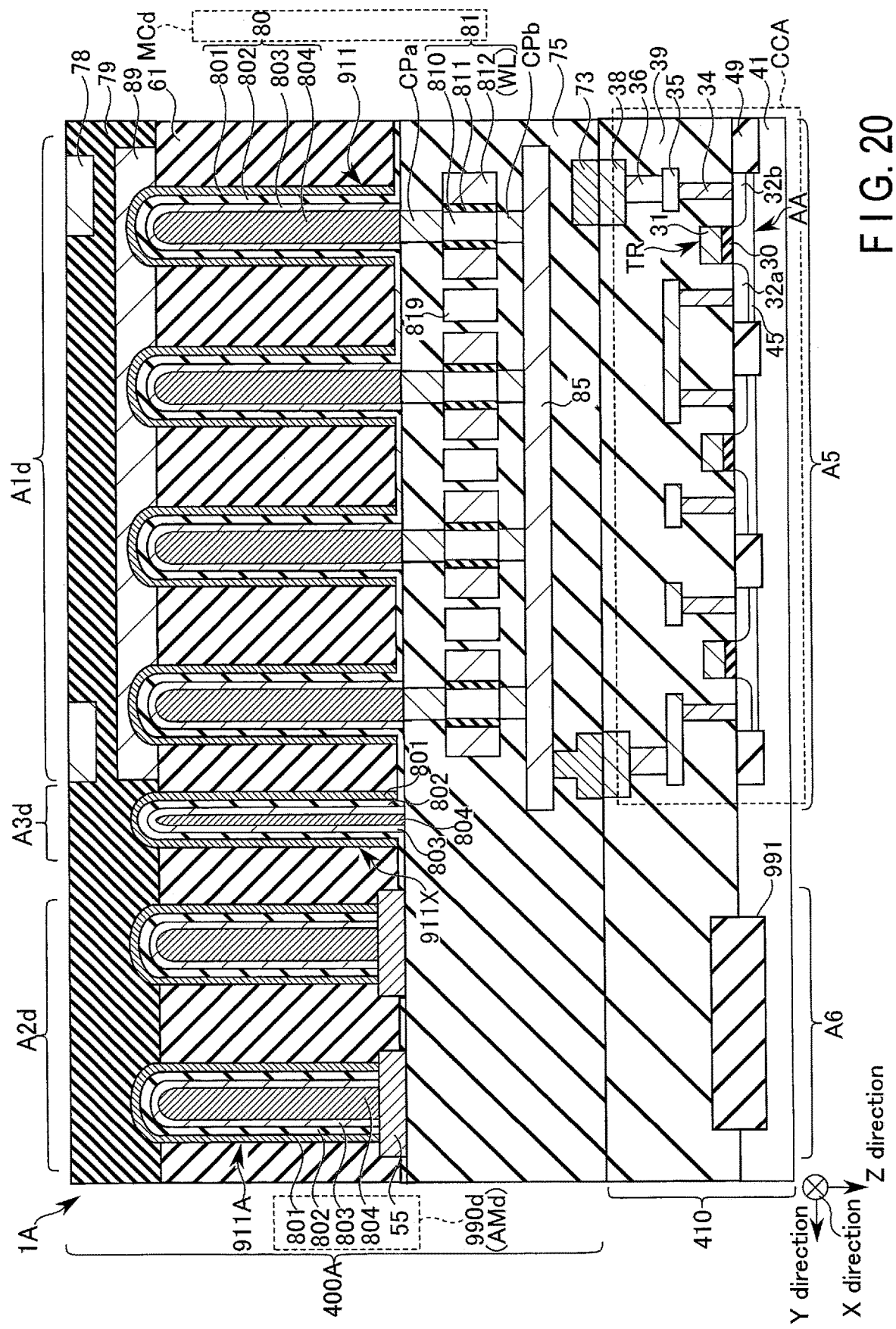
FIG. 20 is a diagram showing an exemplary configuration of the memory cell array of the memory device of the second embodiment.

FIG. 20 is a sectional view showing an exemplary configuration of a DRAM of the second embodiment. In FIG. 20, a section (Y-Z plane) of a DRAM 1A along the Y direction is shown.

As shown in FIG. 20, the DRAM 1A includes a plurality of chips 400A and 410 which are bonded together, as in the magnetic memory of the first embodiment.

The memory cell array chips 400A are electrically connected to the memory control circuit CCA by pads 73 provided in the memory cell array chip 400A and pads 38 provided in the memory control circuit chip 410.

Like in the first embodiment, the memory control circuit CCA is provided on the silicon substrate 41. The memory cell array chips 400A are provided above the memory control circuit chip 410A in the Z direction.

The memory cell array chip 400A includes an alumina layer 61. The alumina layer 61 overlaps a substrate (memory control chip) in the Z direction.

The cell capacitor 80 is provided in the alumina layer 61. The cell transistor 81 is provided below the alumina layer 61 in the Z direction. The cell transistor 81 is provided between the cell capacitor 80 and the memory control circuit CCA in the Z direction.

The alumina layer 61 has a plurality of alumina holes 911 and 911A. In the second embodiment, the alumina holes 911 and 911A each have a quadrangular sectional structure when viewed from the X direction (or Y direction). In the second embodiment, however, the alumina holes 911 and 911A may have a constricted structure as in the first embodiment.

Like in the foregoing example of the first embodiment (see FIG. 6, for example), the memory cells MCd are arranged in the X-Y plane of the memory cell array 100A by the layout (pattern) of a hexagonal lattice. With respect to the layout of seven memory cells MCd included within one unit of the hexagonal lattice, six of the seven memory cells MCd are located at their respective apexes of the hexagon and the remaining one memory cell MCd is located at the center of the hexagon.

The cell capacitors 80 (alumina holes 911) are arranged in the alumina layer (alumina plate) 61 in a hexagonal lattice.

In a plurality of memory cells arranged in a hexagonal lattice, a memory cell MCd connected to one of adjacent two word lines WL in the Y direction is provided in a direction oblique to the Y direction (and X direction) with respect to a memory cell MCd connected to the other word line WL.

A memory cell connected to a word line adjacent to one end of a word line in the Y direction is connected to the same bit line as a memory cell connected to a word line adjacent to the other end of the word line in the Y direction, and thus these memory cells are aligned on a straight line in the Y direction.

The cell capacitor 80 is provided in an alumina layer 61 formed by anodic oxidation.

The cell capacitor 80 includes two capacitor electrodes 801 and 803, a capacitor insulating layer 802 and a storage node electrode (embedded electrode) 804.

The storage node electrode 804 is shaped like a column (or an elliptic cylinder). The storage node electrode 804 has a circular (or elliptical) planar shape when viewed from the Z direction.

The capacitor electrode 801 is opposed to the side and the bottom of the storage node electrode 804.

The capacitor electrode 801 has a cylindrical (cup-shaped) structure. For example, the capacitor electrode 801 includes a cylindrical portion extending in the Z direction and a bottom portion having a circular (or elliptical) planar shape to which the cylindrical portion is connected.

The capacitor electrode 803 is opposed to the side part and the bottom of the capacitor electrode 801 with the capacitor insulating layer 802 therebetween. The capacitor electrode 803 has a cylindrical (cup-shaped) structure. For example, the capacitor electrode 803 includes a cylindrical portion extending in the Z direction and a bottom portion having a circular (or elliptical) planar shape to which the cylindrical portion is connected.

Note that the capacitor electrode 803 and the storage node electrode 804 may be a single structure made of one material.

The capacitor insulating layer 802 is provided between the capacitor electrodes 801 and 803. The capacitor insulating layer 802 is opposed to the side and the bottom of the capacitor electrode 801. The capacitor insulating layer 802 has a cylindrical structure. For example, the capacitor insulating layer 802 includes a cylindrical portion extending in the Z direction and a bottom portion having a circular (or elliptical) planar shape to which the cylindrical portion is connected.

The capacitor electrode 801 and capacitor insulating layer 802 are provided between the capacitor electrode 803 and plate electrode 89 (plate line PL). The capacitor electrode 803 is separated from the plate electrode 89. The capacitor electrode 801 is directly connected to the plate electrode 89.

The capacitor electrodes 801 and 803 include a conductive compound layer (e.g., a titanium nitride layer). The capacitor insulating layer 802 includes a single-layered or multi-layered high dielectric layer (e.g., a zirconium oxide layer or an aluminum oxide layer). The storage node electrode 804 includes a metal layer (e.g., a tungsten layer) or a conductive semiconductor layer (e.g., a polysilicon layer). The plate electrode 89 includes a metal layer (e.g., a tungsten layer). Note that the materials of the members 801, 802, 803, 804 and 89 are not limited to those described above.

A plurality of cell transistors (vertical field effect transistors having a GAA structure) 81 are arranged in the X-Y plane in a hexagonal lattice. In each of the memory cells MC, the cell transistor 81 overlaps the capacitor 80 in the Z direction.

Each cell transistor 81 includes a semiconductor layer 810, a gate insulating layer 811 and a gate electrode 812. The source/drain regions and channel region of the cell transistor 81 are provided in the semiconductor layer 810.

The semiconductor layer 810 has a columnar structure. The planar shape of the semiconductor layer 810 is circular. The semiconductor layer 810 extends in the Z direction. The semiconductor layer 810 includes at least one selected from a silicon layer, a germanium layer, compound semiconductor layer and an oxide semiconductor layer. For example, when an oxide semiconductor layer such as InGaZnO is used in the semiconductor layer 810, the cell transistor 81 is improved in its off-leak characteristics.

The gate insulating layer 811 has a cylindrical structure. The gate insulating layer 811 covers the side of the semiconductor layer 810. The cylindrical gate insulating layer 811 is concentric with the cylindrical semiconductor layer 810. The gate insulating layer 811 is provided on the side of the semiconductor layer 810 (surface of the semiconductor layer 810 along the Z direction). The gate insulating layer 811 is provided between the semiconductor layer 810 and the gate electrode 812. The gate insulating layer 811 includes, for example, at least one of a silicon oxide layer and a high dielectric insulating film. The gate insulating layer 811 may have a single layer structure or a stacked layer structure.

The gate electrode 812 has a cylindrical structure. The semiconductor layer 810 penetrates the gate electrode 812. The gate electrode 812 is opposed to the side of the semiconductor layer 810 with the gate insulating layer 811 therebetween. Part of the semiconductor layer 810 opposed to the gate electrode 812 serves as an effective channel region of the cell transistor 81.

The gate electrode 812 is connected to, for example, the conductive layer (referred to as a gate interconnect hereinafter) 819. For example, the gate electrode 812 is continuous with the conductive layer 819. The gate electrodes 812 of the cell transistors 81 adjacent to each other in the X direction (or an oblique direction parallel to the X-Y plane and intersecting the X and Y directions) are connected via the gate interconnect 819. The gate electrode 812 and gate interconnect 819 function as word lines WL.

The gate electrode 812 and gate interconnect 819 are, for example, a metal layer such as a tungsten layer, a conductive semiconductor layer, or a conductive compound layer.

The bit lines BL are provided to overlap the cell transistors 81 in the Z direction.

For example, each bit line BL is provided between its corresponding cell transistor 81 and the silicon substrate 41 in the Z direction.

In the memory cell array area A1$d$, the alumina holes 911 are regularly arranged at predetermined pitches (spacings) Dp1. The alumina holes 911 are laid out in the X-Y plane in a hexagonal lattice.

At one end of the memory cell array chip 400A (alumina layer 61) in the X (or Y) direction, the alignment mark area A2$d$ is provided adjacent to the memory cell array area A1$d$ in the X (or Y) direction.

Like in the first embodiment, in the second embodiment, a mark portion 990$d$ for an alignment mark AMd is provided in the alignment mark area A2$d$.

The mark portion 990$d$ includes members 801, 802, 803 and 804 in one or more alumina holes in the alignment mark area A2$d$.

In the alignment mark area A2$d$, a plurality of alumina holes 911A (mark members 990$d$) are regularly arranged at predetermined pitches (spacings) Dp2 like the alumina holes 911 (cell capacitors 80). The alumina holes 911A are laid out in the X-Y plane in a hexagonal lattice.

The alignment mark area A2$d$ is provided in the dicing area of a wafer that has not been chipped in the memory cell array area A1$d$.

In the memory cell array chip 400A, an intermediate area (irregular alignment area) A3$d$ is provided between the memory cell array area A1$d$ and the alignment mark area A2$d$.

The intermediate area A3$d$ includes a plurality of alumina holes 911X. The alumina holes 911X are arranged at random pitches in an irregular pattern.

Note that the DRAM 1A of the second embodiment performs a write sequence and a read sequence by known operation. The operation of the DRAM 1A will not be described.

(2b) Manufacturing Method

The memory device (e.g., DRAM) of the second embodiment will be described with reference to FIGS. 21 through 25.

None of FIGS. 21 through 25 shows holes to be formed in the intermediate area A3d or members in the holes. However, the members in the intermediate area A3d are formed substantially in the same manner as the members in the areas A1d and A2d, except for their shapes and dimensions.

Figure 21:
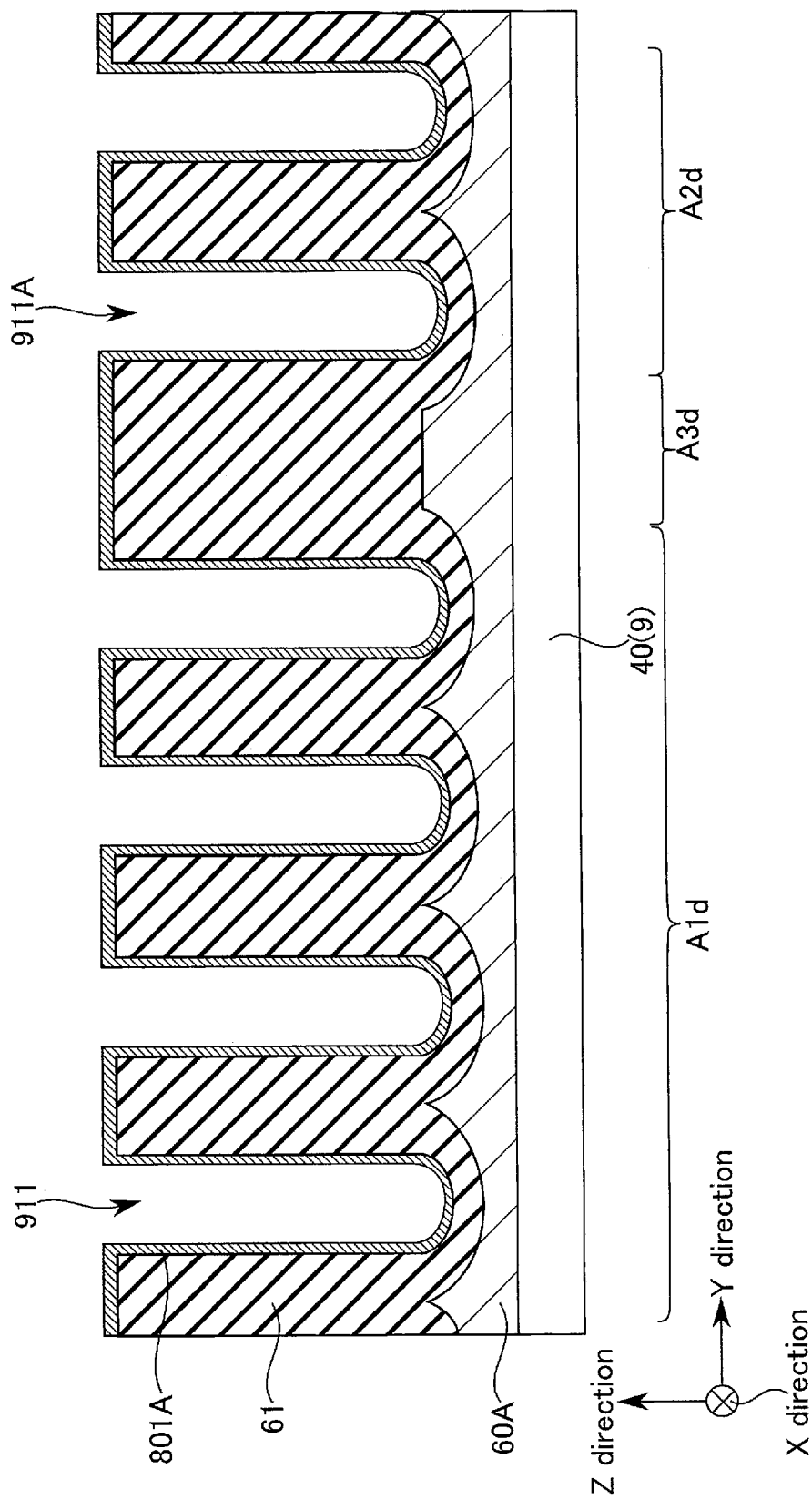
FIGS. 21, 22, 23, 24, and 25 are sectional views each showing one step of a method for manufacturing the memory device of the second embodiment.

FIG. 21 is a schematic sectional view showing one step of the method for manufacturing the DRAM of the second embodiment.

As shown in FIG. 21, anodic oxidation is performed for an aluminum layer on which a reaction starting point (recess) is formed, by substantially the same process as that of FIGS. 8 through 10 described above. An alumina layer 61 is thus formed on the silicon substrate 40 (wafer 90). In the memory cell array area A1d and alignment mark area A2d, a plurality of alumina holes 911 and 911A are formed in the alumina layer 61 at predetermined pitches Dp1 and Dp2.

In the second embodiment, anodic oxidation voltage V1 is maintained without being modulated. Thus, the sectional shape of the alumina hole 911A viewed from the X direction (or Y direction) is substantially quadrangular.

A conductive layer (e.g., a titanium nitride layer) 801A is formed in the alumina holes 911 and 911A and on the upper surface of the alumina layer 61 by CVD or ALD. The conductive layer 801A is a layer for forming the capacitor electrode 801.

The thickness of the conductive layer 801A is controlled such that the alumina hole 911A is not blocked by the conductive layer 801A. The thickness of the conductive layer 801A is about several nanometers.

Figure 22:
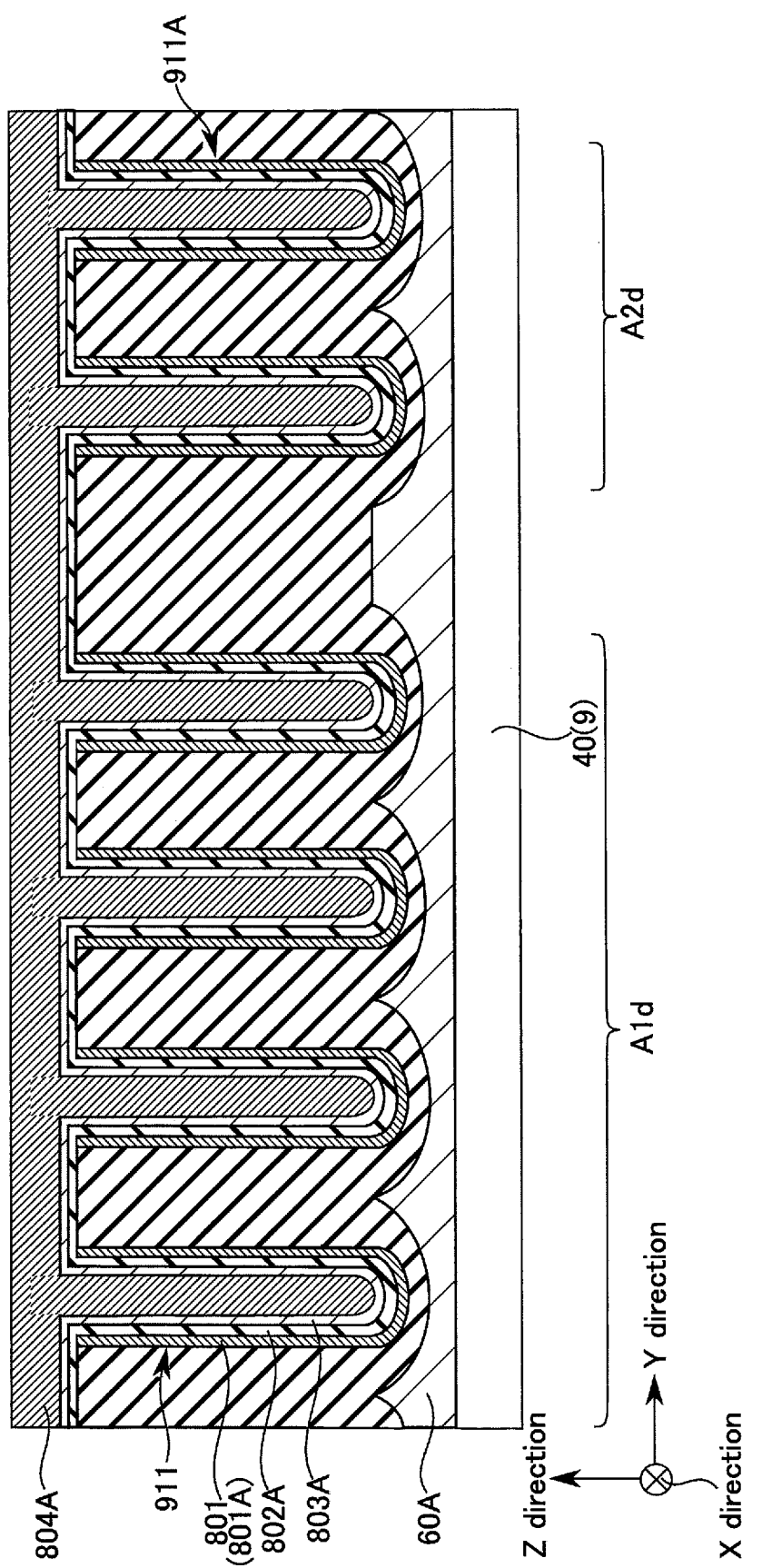

FIG. 22 is a schematic sectional view showing one step of the method for manufacturing the DRAM of the second embodiment.

As shown in FIG. 22, a conductive layer covering the upper surface of the alumina layer 61 is removed by wet etching or dry etching. Accordingly, the conductive layer (capacitor electrode) 801 is separated for each of the alumina holes 911 and 911A.

A high dielectric insulating layer (e.g., a zirconia oxide layer) 802A is formed on the upper surface of the alumina layer 61 and on the conductive layer 801 by CVD or ALD.

A conductive layer (e.g., a titanium nitride layer) 803A is formed on the insulating layer 802A by CVD or ALD. For example, the thickness of the insulating layer 802A and that of the conductive layer 803A are controlled such that the alumina holes 911 and 911A are not blocked by the insulating layer 802A and conductive layer 803A. The thickness of each of the conductive layer 803A and the insulating layer 802A is about several nanometers.

A conductive layer 804A is formed on the conductive layer 803A in the alumina holes 911 and 911A. The alumina holes 911 and 911A are embedded by the conductive layer 804A. The conductive layer 804A is a silicon layer, a silicon germanium layer or the like.

Figure 23:
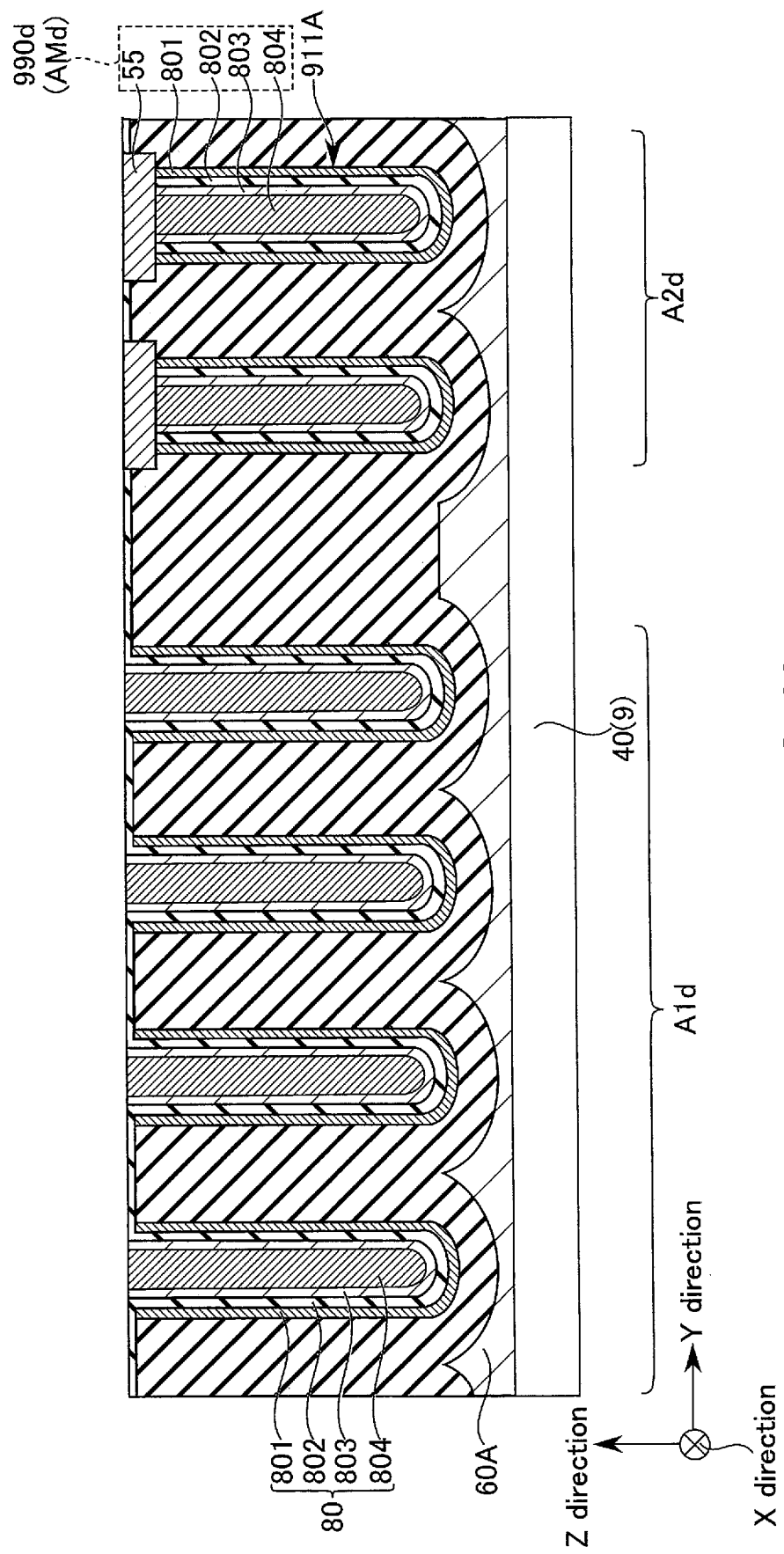

FIG. 23 is a schematic sectional view showing one step of the method for manufacturing the DRAM of the second embodiment.

As shown in FIG. 23, the conductive layer on the upper surface of the alumina layer 61 is etched back by wet etching or dry etching. Accordingly, the conductive layers 803 and 804 are separated for each of the alumina holes 911 and 911A.

A cell capacitor 80 is formed in the alumina hole 911.

A mark portion 990d is formed in the alumina hole 911A at substantially the same time when the cell capacitor 80 is formed.

In addition, like in the first embodiment, a conductive layer 55 may be formed on the upper portion (opening side of the alumina hole 911A) of the alumina hole 911A in order to clarify the boundary between adjacent areas A1 and A3.

As described above, in the second embodiment, the alumina holes 911 and 911A are arranged in the memory cell array area A1d and alignment mark area A2d at predetermined pitches by the steps described above.

The cell capacitor 80 and the alignment mark AMd are laid out in a hexagonal lattice in the memory cell array area A1d and the alignment mark area A2d.

Figure 24:
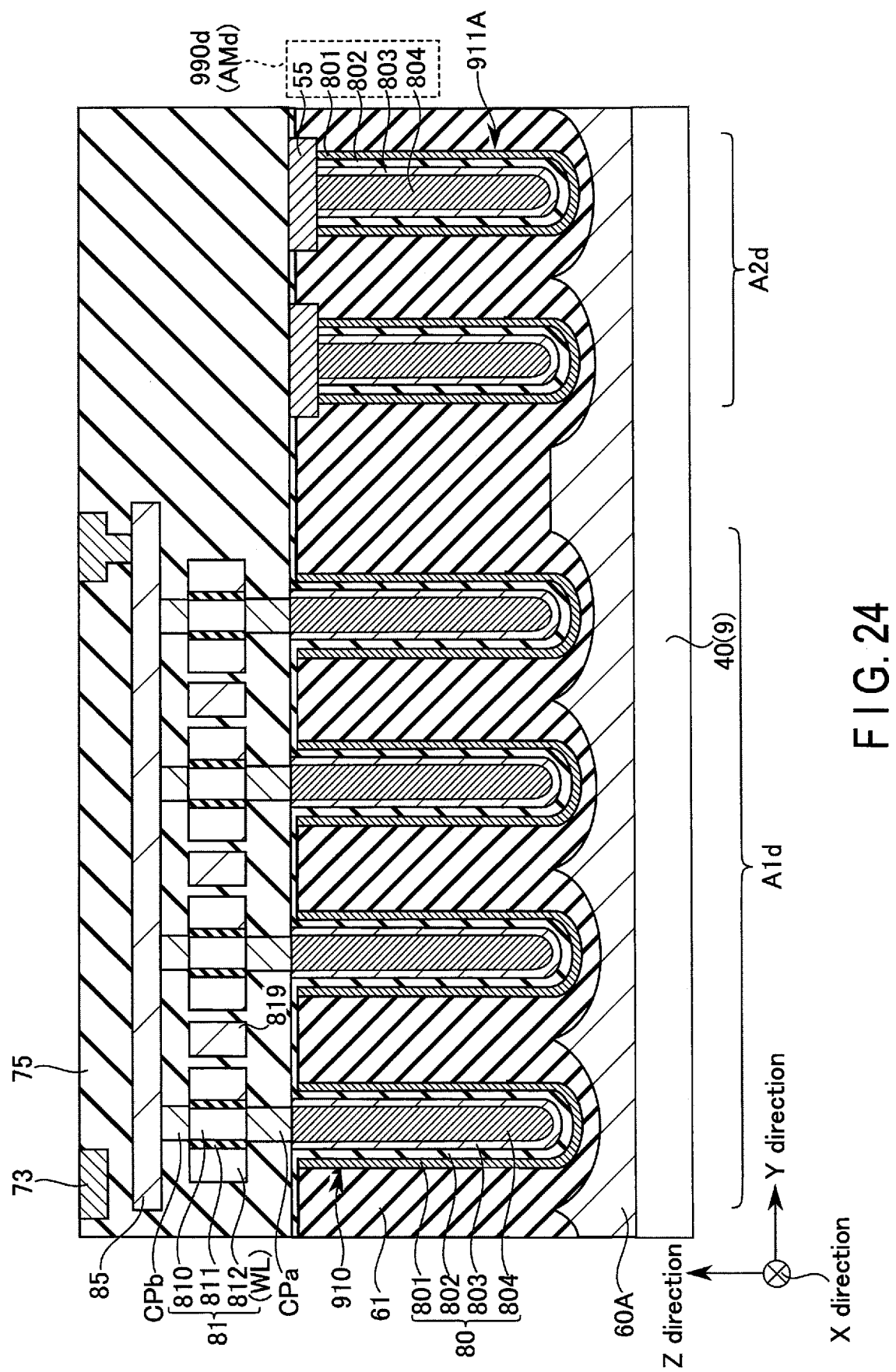

FIG. 24 is a schematic sectional view showing one step of the method for manufacturing the DRAM of the second embodiment.

As shown in FIG. 24, a plurality of cell transistors 81 are formed above the alumina layer 61 in the Z direction by the known technique. The cell transistors 81 are formed above their respective capacitors 80 in the Z direction.

After that, an interconnect (e.g., a bit line) 85 and bonding pads 73 are formed.

Lithography (e.g., photolithography) is performed for patterning of each of the components 81, 85 and 73 of the memory cell array 100A. In the second embodiment, a mask for the lithography is aligned with the substrate 40 (wafer 9) using the alignment mark AMd formed by anodic oxidation.

Figure 25:
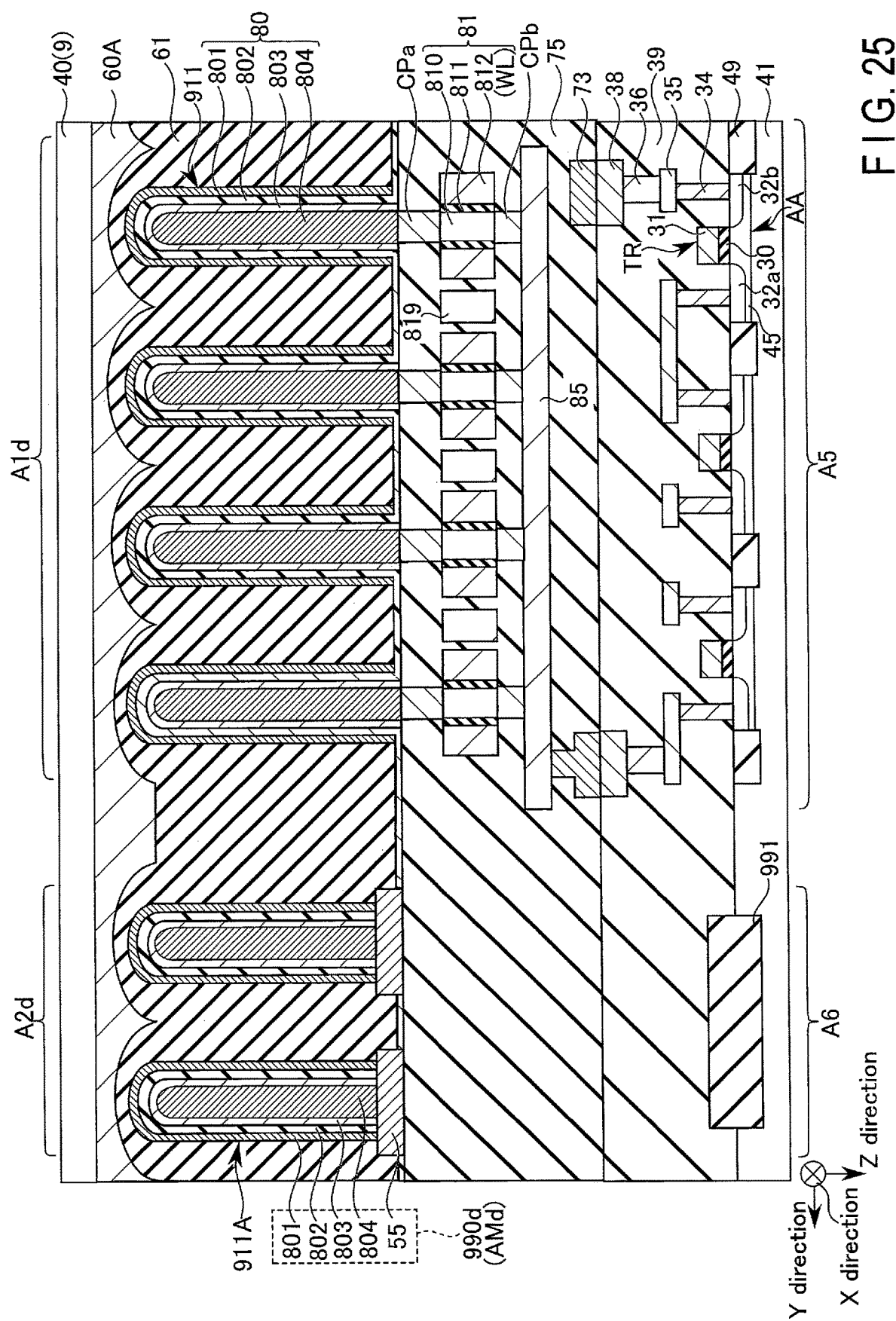

FIG. 25 is a schematic sectional view showing one step of the method for manufacturing the DRAM of the second embodiment.

As shown in FIG. 25, a second silicon substrate 40 is bonded to a first silicon substrate 41 such that the bonding pad 73 of the first silicon substrate 40 is opposed to the bonding pad 38 of the second silicon substrate 41 by substantially the same step as that of FIG. 13 described above.

When wafers are bonded to each other, the first and second silicon substrates 40 and 41 are aligned with each other using the alignment mark 991 of the second silicon substrate 41 and the alignment mark Amd (990d) of the first silicon substrate 40.

After that, silicon is removed, by a process such as backgrinding, from a second surface (surface opposed to the bonding surface) of the substrate (wafer) on which a memory cell array is formed, by substantially the same step as those shown in FIGS. 14 and 15 described above. An unreacted aluminum layer is also removed. Accordingly, the exposed alumina barrier layer is removed.

Thus, the capacitor electrode 801 in the alumina hole 911 is exposed.

As shown in FIG. 20, an interconnect (plate electrode) 89 is formed on the capacitor electrode 801 and the alumina layer 61. An interlayer insulating layer 79 is formed on the interconnect 89 and alumina layer 61. A pad 78 is formed in the interlayer insulating layer 79.

When the interconnect 89 and the pad 78 are formed, the alignment mark AMd of the memory cell array chip 400A may be used to align a wafer and a mask for lithographic are aligned with each other.

Thus, the DRAM 1A of the second embodiment is formed with the memory control circuit chip (wafer) 41 as a support substrate.

After that, the DRAM 1A of the second embodiment is chipped by dicing the wafer 9. At this time, part or all of the alignment marks 990d (AMd) in the dicing area A2d may be cut or removed from the chip of the DRAM 1A.

The DRAM of the second embodiment described above is thus completed.

The memory device (and the method for manufacturing the memory device) of the second embodiment can bring about substantially the same advantages as those of the first embodiment.

(3) Modification

A modification to the memory devices of the above embodiments will be described with reference to FIGS. 26 through 28.

Figure 26:
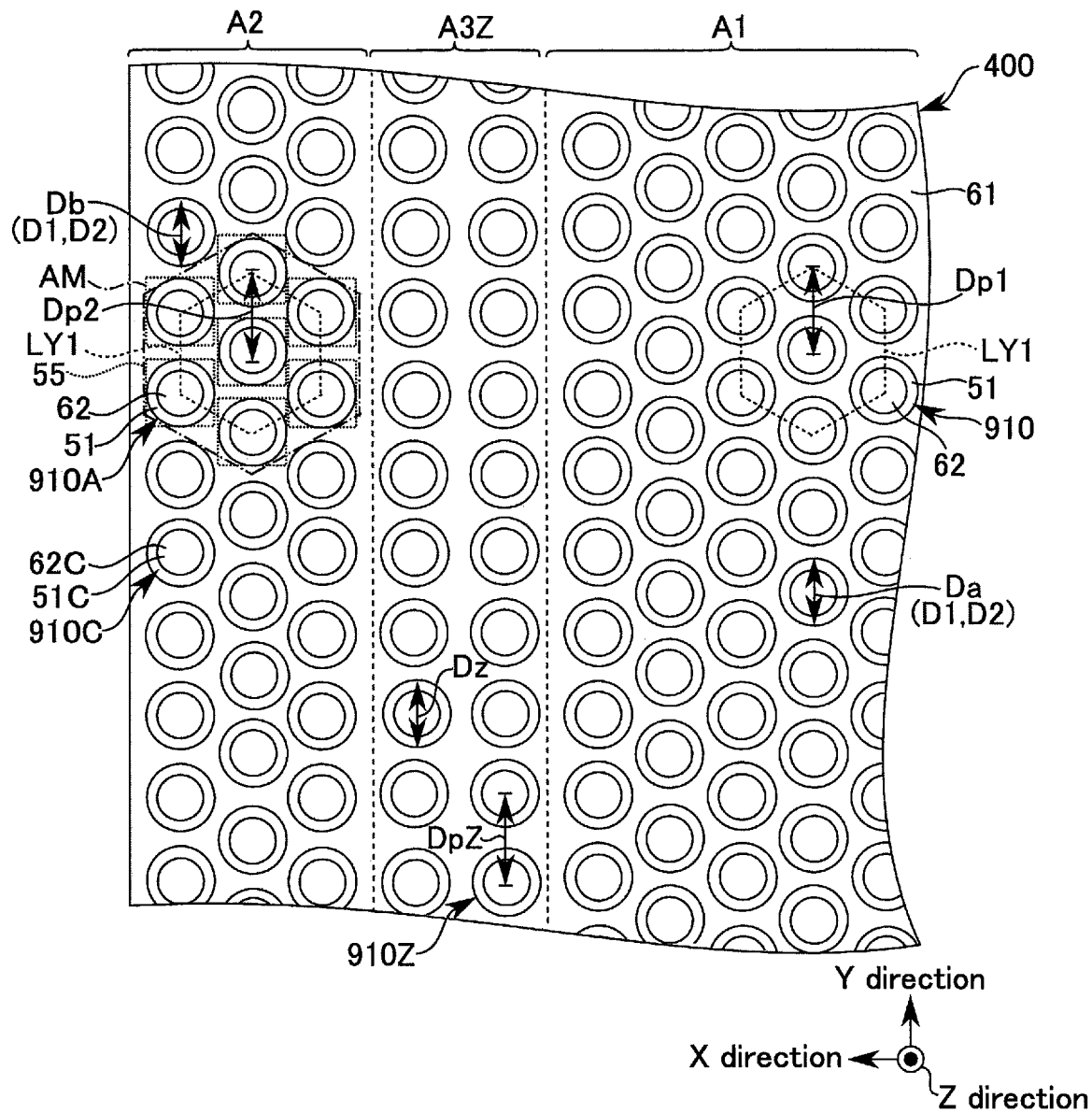
FIGS. 26, 27, and 28 are diagrams showing a modification to the memory devices of the embodiments.

FIG. 26 is a schematic top view illustrating a modification to the memory devices of the embodiments.

As shown in FIG. 26, in a memory device (e.g., a domain wall memory) of the modification, a plurality of alumina holes 910Z may be arranged regularly at predetermined pitches Dp3 in an area A3Z between the memory cell array area A1 and the alignment mark area A2.

For example, in the area A3Z, the alumina holes 910Z are arranged in a layout different from that of the alumina holes 910 and 910A in the areas A1 and A2.

In this case, the pitches Dp3 of the alumina holes 910Z may differ from the pitches Dp1 and Dp2 of the alumina holes 910 and 910A in the areas A1 and A2.

The dimensions Dz of the alumina holes 910Z in a direction parallel to the surface of the substrate may differ from the dimensions Da and Db of the alumina holes 910 and 910A in the areas A1 and A2.

In the area A2, alumina holes 910C (and members 51C and 62C in the holes 910C) other than the alumina holes 910A used for the alignment mark AM may be arranged at predetermined pitches (e.g., pitches Dp2).

In this case, the alignment mark AM can be distinguished from the members 51C and 62C in the alumina holes 910C according to the presence or absence of the conductive layer 55.

Figure 27:
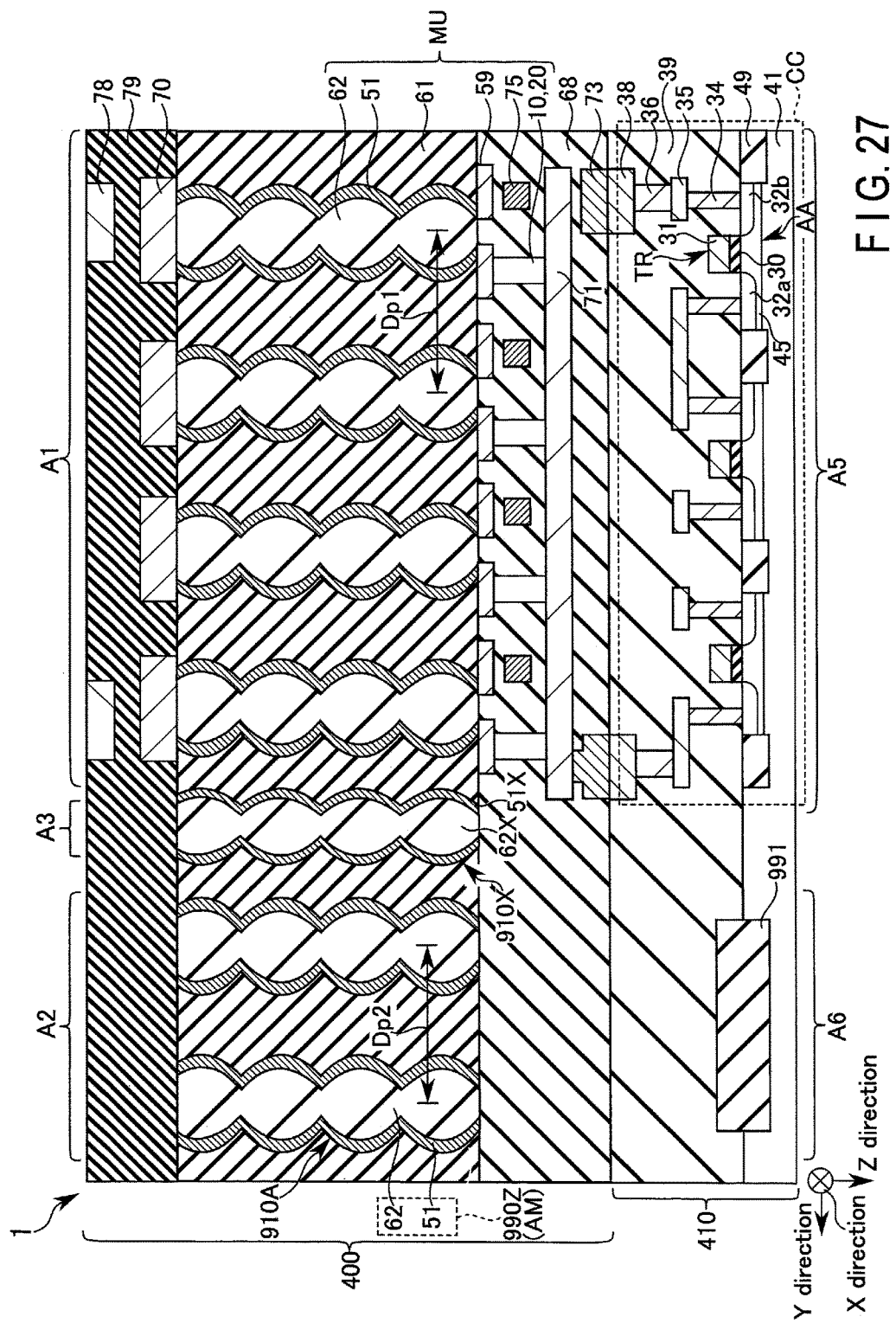

FIG. 27 is a schematic sectional view illustrating a modification to the memory devices of the embodiments.

As shown in FIG. 27, a layer for clarifying a boundary between adjacent areas A2 and A3 need not be provided in the alignment mark area A2.

In this case, a mark portion 990Z has substantially the same configuration as that of members 51 and 62 in each of the alumina holes 910 in the memory cell array area A1.

Figure 28:
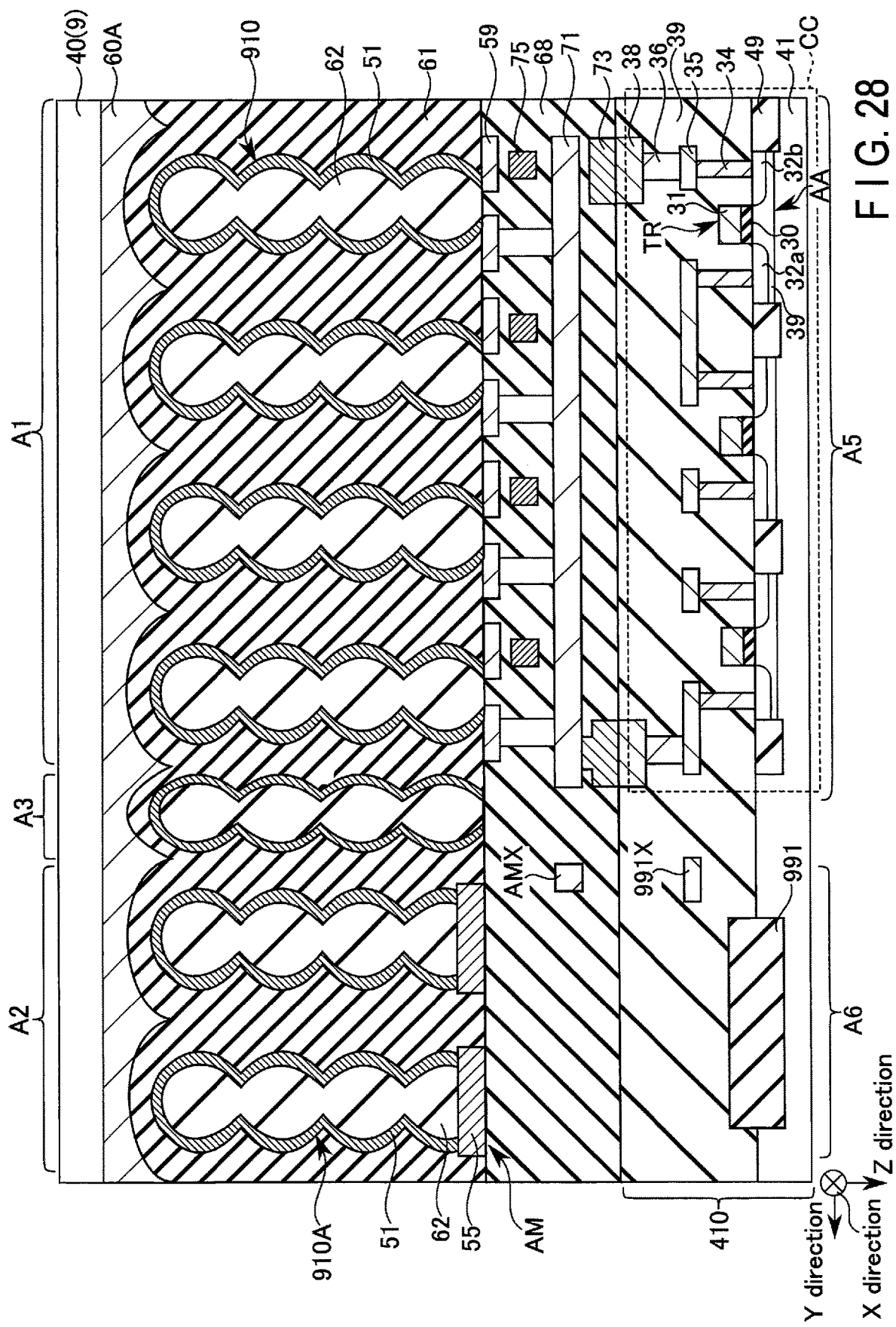

FIG. 28 is a schematic sectional view illustrating a modification to the memory device manufacturing methods of the embodiments.

Two silicon substrates 40 and 41 may be aligned with each other using at least one of an alignment mark AMX formed using a mark AM and an alignment mark 991X formed using a mark 991, as may be the substrates 40 and 41 and various masks.

For example, the mark AMX aligned with the mark AM is located at a position (level) different from that of the mark AM in the Z direction. The mark AMX is formed in the insulating layer 68 covering the upper surface (bonding surface) of the alumina layer 61, using the mark AM for lithography alignment during the formation of components (e.g., interconnects) on the wafer 40.

For example, the mark AMX is used to perform lithography alignment for formation of pads and interconnects on the wafer 40 or alignment of the wafers 40 and 41.

FIG. 28 shows an example in which the mark AMX is provided in the vicinity of a region vertically aligned with the mark AM in the Z direction. If, however, the mark AMX is a pattern formed by a manufacturing process using the mark AM for lithography alignment, the mark AMX need not be provided in the vicinity of the mark AM. The mark AMX may be provided to overlap the alignment mark AM in the Z direction. In addition, the mark AMX may be formed on the side opposed to the bonding surface of the memory cell array chip 400 (silicon wafer 40).

For example, the mark 991X aligned with the mark 991 is located at a position (level) different from that of the mark 991 in the Z direction. The mark 991X is formed in the insulating layer 39 covering the upper surface (bonding surface) of the wafer 41, using the mark 991 for lithography alignment during the formation of components (e.g., interconnects) on the wafer 41.

For example, the mark 991X is used to perform lithography alignment for formation of pads and interconnects on the wafer 41 or alignment of the wafers 40 and 41.

FIG. 28 shows an example in which the mark 991X is provided in the vicinity of a region vertically aligned with the mark 991 in the Z direction. If, however, the mark 991X is a pattern formed by a manufacturing process using the mark 991 for lithography alignment, the mark 991X need not be provided in the vicinity of the mark AM. The mark 991X may be provided to overlap the alignment mark 991

Note that any one of the reading element 10, switching element 20 and write interconnect WRL may be provided on the side opposite to the bonding surface of the memory cell array chip 400 (silicon wafer 40). In this case, the reading element 10, switching element 20 and write interconnect WRL are formed after the wafers 40 and 41 are bonded to each other.

The modifications shown in FIGS. 26 through 28 may be applied to the DRAM of the second embodiment.

The modifications shown in FIGS. 26 through 28 can bring about substantially the same advantages as those of the above-described embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first chip including a first insulating layer and a first pad;
   a plurality of memory units provided in a first area of the first insulating layer and arranged at first intervals along a first direction parallel to a surface of the first chip, each of the plurality of memory units including a first columnar portion extending along a second direction in the first insulating layer, the second direction being perpendicular to the surface of the first chip;
   a plurality of mark portions provided in a second area of the first insulating layer and arranged at second intervals along the first direction, each of the plurality of mark portions including a second columnar portion extending along the second direction in the first insulating layer;
   a second chip including a second pad connected to the first pad and overlapping the first chip along the second direction; and
   a circuit provided in the second chip,
   wherein
   the plurality of mark portions are electrically isolated from the plurality of memory units and the circuit, the first columnar portion includes a capacitor, the capacitor includes a first conductive portion, a second conductive portion, and a first insulating portion between the first conductive portion and the second conductive portion, the second columnar portion includes a third conductive portion, a fourth conductive portion, and a second insulating portion between the third conductive portion and the fourth conductive portion, a material of the first conductive portion is identical to a material of the third conductive portion, a material of the second conductive portion is identical to a material of the fourth conductive portion, and a material of the first insulating portion is identical to a material of the second insulating portion.

2. The memory device of claim 1, further comprising a plurality of first members provided in a third area between the first area and the second area in the first insulating layer, wherein:

the plurality of memory units are arranged in the first area in a first layout pattern;

the plurality of mark portions are arranged in the second area in the first layout pattern; and the plurality of first members are arranged in the third area in a random layout pattern.

3. The memory device of claim 1, further comprising a plurality of second members provided in the second area in a random layout pattern.

4. The memory device of claim 1, wherein the first insulating layer is an aluminum oxide layer.

5. The memory device of claim 1, wherein each of the plurality of memory units and each of the plurality of mark portions has a structure including a plurality of constricted portions arranged along the second direction.

6. The memory device of claim 1, wherein each of the first and second columnar portions has a structure including a plurality of constricted portions, and the plurality of constricted portions are periodically arranged along the second direction.

7. The memory device of claim 1, wherein the plurality of mark portions are provided for an alignment of the first chip and the second chip.

8. A memory device comprising:

a first chip including a first insulating layer and a first pad;

a plurality of memory units provided in a first area of the first insulating layer and arranged at first intervals along a first direction parallel to a surface of the first chip;

a plurality of mark portions provided in a second area of the first insulating layer and arranged at second intervals along the first direction;

a second chip including a second pad connected to the first pad and overlapping the first chip in a second direction perpendicular to the surface of the first chip; and a circuit provided in the second chip, wherein each of the plurality of memory units includes a first magnetic body and a reading element connected to one end of the magnetic body.

9. The memory device of claim 8, wherein each of the plurality of mark portions includes a second magnetic body and a first layer provided on the second magnetic body in the second direction.

10. The memory device of claim 8, wherein:

each of the plurality of memory units includes a first columnar portion extending along the second direction in the first insulating layer; and each of the plurality of mark portions includes a second columnar portion extending along the second direction in the first insulating layer.

11. The memory device of claim 8, further comprising a plurality of first members provided in a third area between the first area and the second area in the first insulating layer, wherein:

the plurality of memory units are arranged in the first area in a first layout pattern;

the plurality of mark portions are arranged in the second area in the first layout pattern; and the plurality of first members are arranged in the third area in a random layout pattern.

12. The memory device of claim 8, further comprising a plurality of second members provided in the second area in a random layout pattern.

13. The memory device of claim 8, wherein the first insulating layer is an aluminum oxide layer.

14. The memory device of claim 8, wherein each of the plurality of memory units and each of the plurality of mark portions has a structure including a plurality of constricted portions arranged along the second direction.

15. The memory device of claim 14, wherein the plurality of constricted portions are periodically arranged along the second direction.

* * * * *